US011714493B2

(12) United States Patent
Chung et al.

(10) Patent No.: US 11,714,493 B2
(45) Date of Patent: Aug. 1, 2023

(54) ELECTROMAGNETICALLY TRACKED THREE-DIMENSIONAL AIR MOUSE

(71) Applicant: GOOGLE LLC, Mountain View, CA (US)

(72) Inventors: Sherk Chung, Piedmont, CA (US); Ian Atkinson, Castro Valley, CA (US); Murphy Stein, San Jose, CA (US); Advait Jain, Santa Clara, CA (US); Saket Patkar, Mountain View, CA (US); Lucine Oganesian, Redwood City, CA (US); Xiaomi Mao, Sunnyvale, CA (US); Tri Pho, San Bruno, CA (US); Joe Ethier, San Jose, CA (US); Jacob Sharf, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 209 days.

(21) Appl. No.: 17/250,879

(22) PCT Filed: Apr. 12, 2019

(86) PCT No.: PCT/US2019/027232
§ 371 (c)(1),
(2) Date: Mar. 18, 2021

(87) PCT Pub. No.: WO2020/209864
PCT Pub. Date: Oct. 15, 2020

(65) Prior Publication Data
US 2021/0349541 A1    Nov. 11, 2021

(51) Int. Cl.
*G06F 3/01* (2006.01)
*H04B 17/318* (2015.01)
(Continued)

(52) U.S. Cl.
CPC ............ *G06F 3/017* (2013.01); *G06F 3/0346* (2013.01); *G06F 3/0383* (2013.01);
(Continued)

(58) Field of Classification Search
CPC .... G06F 3/03543; G06F 3/0346; G06F 3/017; G06F 3/03541
See application file for complete search history.

(56) References Cited

U.S. PATENT DOCUMENTS 7,640,106 B1    12/2009  Stokar et al.
9,740,922 B2     8/2017  Csaszar et al.
(Continued)

OTHER PUBLICATIONS

International Search Report and Written Opinion for Application No. PCT/US2019/027232, dated Nov. 28, 2019, 18 pages.
(Continued)

*Primary Examiner* — Koosha Sharifi-Tafreshi
(74) *Attorney, Agent, or Firm* — Kilpatrick Townsend & Stockton LLP

(57) ABSTRACT

A handheld electronic device is described for controlling three-dimensional content displayed in a user interface of a computing device. The handheld electronic device may include an electromagnetic sensing system for detecting a pose of the handheld electronic device in three-dimensional space and at least one communication module to trigger transmission of the commands to manipulate three-dimensional content displayed in the computing device based on detected changes in the pose of the handheld electronic device.

21 Claims, 9 Drawing Sheets

(51) Int. Cl.
*G06F 30/12* (2020.01)
*G06F 3/0346* (2013.01)
*G06F 3/0354* (2013.01)
*G06F 3/038* (2013.01)
*G06F 3/16* (2006.01)

(52) U.S. Cl.
CPC ...... *G06F 3/03541* (2013.01); *G06F 3/03543* (2013.01); *G06F 3/167* (2013.01); *G06F 30/12* (2020.01); *H04B 17/318* (2015.01)

(56) References Cited

U.S. PATENT DOCUMENTS

| | | | |
|---|---|---|---|
| 10,908,680 B1* | 2/2021 | Woods | G02B 27/017 |
| 2014/0362025 A1* | 12/2014 | Sesto | G06F 3/0346 345/174 |
| 2016/0246370 A1 | 8/2016 | Osman | |
| 2017/0123516 A1* | 5/2017 | Li | G08C 23/04 |
| 2018/0108179 A1* | 4/2018 | Tomlin | G06F 3/0346 |
| 2019/0086482 A1 | 3/2019 | Chung et al. | |
| 2019/0187819 A1* | 6/2019 | Ullrich | G06F 3/038 |

OTHER PUBLICATIONS

Zhai, "Human performance in six degree of freedom input control", Ph.D. Thesis, University or Toronto, 1995, 179 pages.

\* cited by examiner

ELECTROMAGNETICALLY TRACKED THREE-DIMENSIONAL AIR MOUSE

CROSS REFERENCE TO RELATED APPLICATION

This application is a 35 U.S.C. § 371 National Phase Entry Application from PCT/US2019/027232 filed Apr. 12, 2019, designating the U.S., the disclosure of which is incorporated herein by reference in its entirety.

TECHNICAL FIELD

This disclosure relates to a computer accessory that incorporates non-line-of-sight (NLOS) 6-DoF (Degrees of Freedom) electromagnetic (EM) tracking technology.

BACKGROUND

Electromagnetic (EM) position tracking systems may use near-field EM fields, transmitters, and receivers to determine position information for particular devices. The EM position tracking systems, in general, may use transmitters that generate an EM signal (e.g., field) that is detected at remote receivers. In one example, a transmitter generates an EM field using a transmitter coil to induce a current on a receiver coil associated with a remote receiver. The receiver generates values corresponding to the EM field magnitude which are then processed to compute a position and/or orientation (i.e., pose) of the receiver relative to the transmitter.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In one general aspect, a handheld electronic device for controlling three-dimensional content displayed in a user interface of a computing device. The handheld electronic device includes an electromagnetic sensing system for detecting, for the handheld electronic device, a pose of the handheld electronic device in three-dimensional space. The handheld electronic device also includes an inertial measurement unit sensor for detecting, for the handheld electronic device, an orientation in three-dimensional space of the handheld electronic device in three-dimensional space. The handheld electronic device also includes at least one processor coupled to memory and the at least one processor is configured to generate commands to manipulate the three-dimensional content in the computing device. The commands may be generated based on a determined proximity of the handheld electronic device relative to a receiver module associated with the computing device. The determined proximity may trigger selection of data for use in generation of the commands. The data may include the pose of the electromagnetic sensing system when the determined proximity indicates that the handheld electronic device is within range of the receiver module, and the orientation of the inertial measurement unit sensor when the determined proximity indicates that the handheld electronic device is out of range of the receiver module. The handheld electronic device also includes at least one communication module to trigger transmission of the commands to manipulate the three-dimensional content displayed in the computing device based on detected changes in pose of the handheld electronic device. Other embodiments of this aspect include corresponding computer systems, apparatus, and computer programs recorded on one or more computer storage devices, each configured to perform the actions of the methods.

Implementations may include one or more of the following features. The handheld electronic device where the handheld electronic device is an air mouse device configured to manipulate three-dimensional computer-aided design objects displayed in the user interface of the computing device. The manipulation of the three-dimensional computer-aided design objects may be based on tracking the pose of the handheld electronic device in three-dimensional space. The handheld electronic device where the handheld electronic device is configured to prioritize use of the electromagnetic sensing system using six degrees of freedom while within range of the receiver module and switch to perform sensing in three degrees of freedom using the inertial measurement unit upon detecting that the handheld electronic device is out of range of the receiver module associated with the computing device. The handheld electronic device where the computing device is removably attached to a dongle where the dongle includes a second processor, a first communication interface with the computing device, and a second communication interface with the handheld electronic device. The dongle may be operable to collect, from the at least one processor of the handheld electronic device and using the first communication interface, data associated with the pose of the handheld electronic device, convert, using the second processor, the data from the electromagnetic sensing system or from the inertial measurement unit sensor, to the commands, and transmit the commands to the computing device using the second communication interface. In some implementations, the dongle further includes an electromagnetic receiver module to interface with a transmitter module associated with the handheld electronic device. In some implementations, the handheld electronic device is configured to communicate pose information to the dongle via a wireless protocol and the dongle is configured to communicate to the computing device via a wired protocol. In some implementations, the wireless protocol is Radio Frequency (RF) and the wired protocol is Universal Serial Bus (USB).

In some implementations, the handheld electronic device also includes a microphone configured to receive voice-based queries for communication from the handheld electronic device to the computing device and a speaker configured to generate audio playback from the handheld electronic device. The audio playback may include information responsive to the voice-based queries.

In some implementations, the handheld electronic device is detected to be out of range of the computing device if a metric correlated to signal noise associated with the electromagnetic sensing system is above a noise threshold. In some implementations, the handheld electronic device further includes a removable trackball. The trackball may include the at least one communication module. The communication module may be configured to transmit commands to control a three-dimensional object in the content according to movements of the trackball in three-dimensional space. In some implementations, a change in a detected pose associated with the trackball causes a corresponding change in a pose of the three-dimensional object.

Implementations of the described techniques may include hardware, a method or process, or computer software on a computer-accessible medium.

In another general aspect, a pose tracking system for an air mouse device is described. The pose tracking system includes an electromagnetic receiver device associated with the air mouse device and configured to determine a 6-DoF pose between a remote electromagnetic transmitter and the electromagnetic receiver device. The remote electromagnetic transmitter may be associated with a computing device. The pose tracking system may also include an inertial measurement sensor configured to determine a 3-DoF pose of the air mouse device. The pose tracking system may also include at least one processor coupled to memory and configured to generate commands using the 6-DoF pose to manipulate three-dimensional content displayed on the computing device, in response to detecting air mouse poses while the air mouse device is communicably coupled to the electromagnetic transmitter. The at least one process may also be configured to generate commands using the 3-DoF pose to manipulate three-dimensional content displayed on the computing device, in response to detecting air mouse poses while the air mouse device is beyond a predetermined range from the electromagnetic receiver device. Other embodiments of this aspect include corresponding computer systems, apparatus, and computer programs recorded on one or more computer storage devices, each configured to perform the actions of the methods.

Implementations may include one or more of the following features. The pose tracking system where the predetermined range is based at least in part on at least one metric that corresponds to a received signal strength detected at the electromagnetic receiver device. The pose tracking system further including at least one communication module to transmit the generated commands to the computing device to control the three-dimensional content displayed on the computing device. The pose tracking system where the air mouse device further includes a removable trackball, the trackball including an electromagnetic sensing system to detect a plurality of poses associated with the air mouse device in which the at least one processor is configured to generate the commands and to transmit commands to control the three-dimensional content according to movements of the trackball in three-dimensional space. The pose tracking system where the processor is configured to generate commands using the 3-DoF pose to trigger manipulation of three-dimensional content displayed on the computing device until the air mouse device is within range of the electromagnetic receiver device and automatically switch to generating commands using the 6-DoF pose to trigger manipulation of three-dimensional content displayed on the computing device when the air mouse device is within range of the electromagnetic receiver device. The air mouse device where the air mouse device is configured to manipulate three-dimensional computer-aided design objects displayed in the user interface of the computing device, the manipulation of the three-dimensional computer-aided design objects being based on tracking the position and orientation of the air mouse device in three-dimensional space. The air mouse device where the air mouse device is configured to prioritize use of the electromagnetic sensing system using six degrees of freedom while within range of the computing device and switch to perform sensing in three degrees of freedom using the inertial measurement unit upon detecting that the air mouse device is out of range of the computing device. The air mouse device where the air mouse device is detected to be out of range of the computing device if a metric correlated to signal noise associated with the electromagnetic sensing system is above a predefined noise threshold. Implementations of the described techniques may include hardware, a method or process, or computer software on a computer-accessible medium.

In another general aspect, an air mouse device is described for controlling content displayed in a user interface of a computing device. The air mouse device may include an electromagnetic sensing system for detecting, for the air mouse device, a three-dimensional position and a three-dimensional orientation responsive to detected movements of the air mouse device in three-dimensional space and an inertial measurement unit sensor for detecting, for the air mouse device, a three-dimensional orientation in three-dimensional space. The air mouse device may also include at least one processor coupled to memory, the at least one processor configured to generate commands to manipulate the content in the computing device. The commands may be generated based on a determined proximity of the air mouse device relative to the computing device, the determined proximity may trigger selection of data for use in generation of the commands, where the data includes the three-dimensional position and the three-dimensional orientation associated with the electromagnetic sensing system when the determined proximity indicates that the air mouse device is within range of the computing device, and the three-dimensional orientation of the inertial measurement unit sensor when the determined proximity indicates that the air mouse device is out of range of the computing device. The air mouse device may also include at least one communication module to trigger transmission of the commands to manipulate the content displayed in the computing device. Other embodiments of this aspect include corresponding computer systems, apparatus, and computer programs recorded on one or more computer storage devices, each configured to perform the actions of the methods.

Implementations may include one or more of the following features. The air mouse device where the air mouse device is configured to manipulate three-dimensional computer-aided design objects displayed in the user interface of the computing device, the manipulation of the three-dimensional computer-aided design objects being based on tracking the position and orientation of the air mouse device in three-dimensional space. The air mouse device where the air mouse device is configured to: prioritize use of the electromagnetic sensing system using six degrees of freedom while within range of the computing device and switch to perform sensing in three degrees of freedom using the inertial measurement unit upon detecting that the air mouse device is out of range of the computing device. The air mouse device where the air mouse device is detected to be out of range of the computing device if a metric correlated to signal noise associated with the electromagnetic sensing system is above a predefined noise threshold. Implementations of the described techniques may include hardware, a method or process, or computer software on a computer-accessible medium.

The details of one or more implementations are set forth in the accompanying drawings and the description below. Other features will be apparent from the description and drawings, and from the claims.

BRIEF DESCRIPTION OF THE DRAWINGS

The use of similar or identical reference numbers in the various drawings is intended to indicate the presence of a similar or identical element or feature.

DETAILED DESCRIPTION

Figure 1:
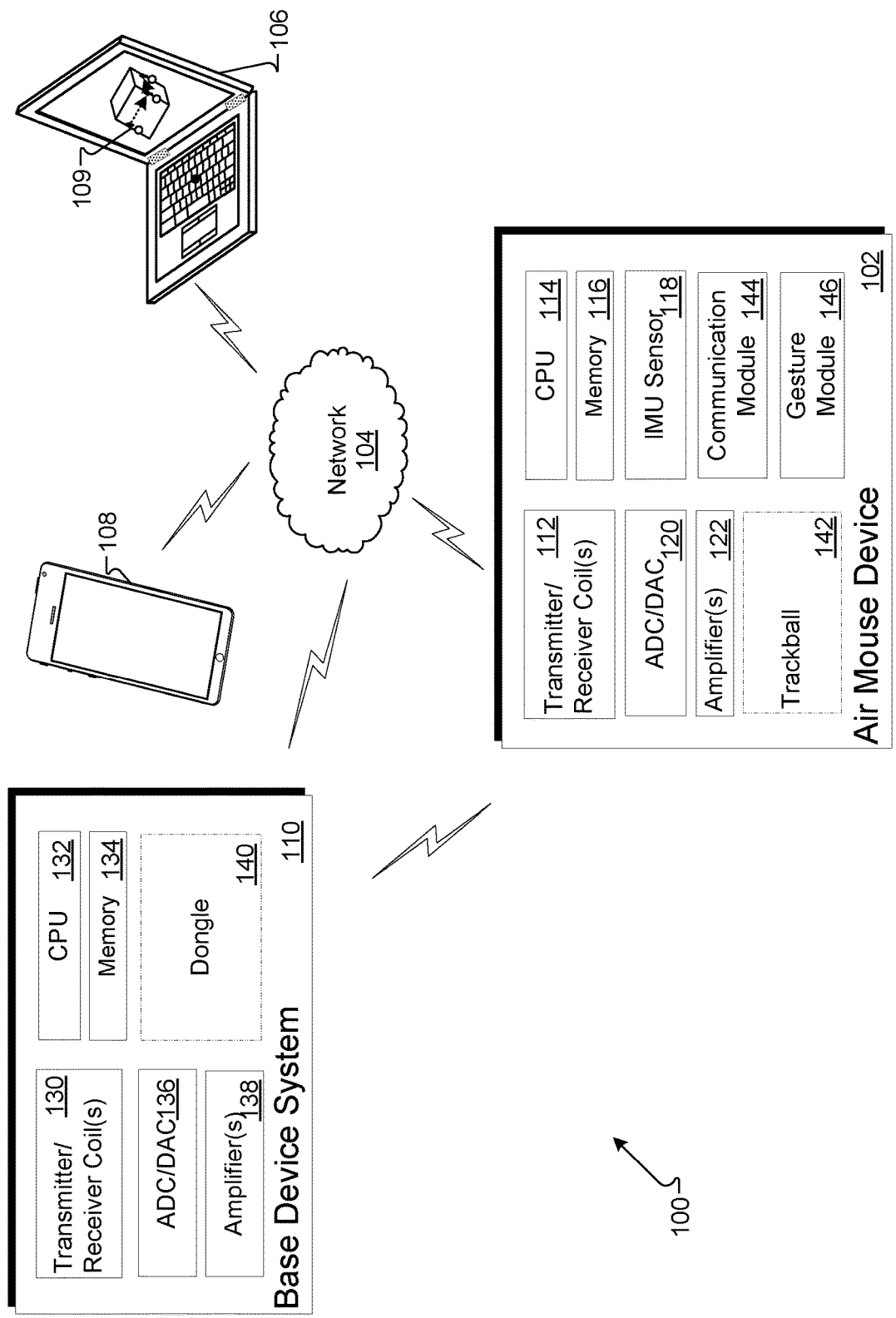
FIG. 1 is a block diagram of an example pose tracking system, in accordance with implementations described herein.

This document describes example input devices and tracking of such input devices for use with computing platforms. In particular, systems and techniques described herein may be used for tracking input devices for use in manipulating three-dimensional (3D) models and/or objects provided for display in a computing device. In some implementations, the input devices described herein may be tracked in a mode using six degrees-of-freedom (6-DoF). In some implementations, the input devices described herein may be tracked in a mode using three degrees-of-freedom (3-DoF). The systems and techniques described herein can determine which mode to use based on proximity of the input device to one or more other devices.

In some implementations, the systems and techniques described in this document may be used to determine and/or toggle the mode of operation and/or tracking for the input devices. According to example implementations described throughout this disclosure, the input devices may be capable of determining full 6-DoF pose data for use in tracking the input devices to allow accurate manipulation of 3D virtual content in an intuitive manner.

For example, the systems and techniques described herein may include input devices that make use of electromagnetic (EM) fields to track 3D position and/or 3D orientation of a still or moving input device. The input devices may make use of an EM tracking system that is divided into a transmitter portion that produces EM fields and a receiver portion that senses EM fields. In some implementations, the transmitter portion resides on a computing device being accessed with the input device while the receiver portion resides on the input device. In some implementations, the transmitter portion resides on the input device while the receiver portion resides on the computing device being accessed with the input device. In some implementations, the transmitter or receiver portion is instead on a third device in the EM tracking system that operates as a base station and may or may not be mechanically (or communicably) coupled to either the input device or the computing device.

The implementations described throughout this disclosure may utilize an input device, such as an air mouse device that incorporates a non-line-of-sight (NLOS) sensing technology, 6-DoF electromagnetic tracking (EM) technology, and 3-DoF tracking technology to track both position and orientation (e.g., pose) of at least one element embedded in the air mouse device. The EM-based air mouse device described herein may provide an advantage over non-EM systems in that the EM-based air mouse device is NLOS and may maintain device tracking despite occlusion of onboard or external sensing elements in the tracking system. Thus, the air mouse device described herein may continue tracking while other technologies (e.g., light-based sensors, ultrasonic sensors, and/or other mediums) may fail to maintain tracking when their respective sensing elements are occluded. Employing the EM tracking technology in the air mouse devices described herein allows for a 6-DoF device that is robust against occlusions caused by palms, fingers, or other body parts blocking sensors of the air mouse device.

The systems and techniques described herein solve a technical problem of accurately tracking an input device (e.g., an air mouse device) to accurately convey, to a user of the input device, manipulations of 3D content in 3D space within a user interface of a computing device. One example technical solution may include an air mouse computer input device that incorporates NLOS, 6-DoF EM tracking technology to track the pose associated with a tracking element embedded in the input device. In some implementations, a secondary sensor may be installed in the input device to provide failsafe backup tracking for the input device.

The technical solutions described herein may provide a technical effect of ensuring a one to one motion correlation in six degrees of freedom between movements carried out by the input device and any resulting movement of an object in virtual 3D space on the computing device. The systems and techniques described herein may provide improved input device movement stability, improved tracking accuracy for the input device, and efficient tracking in 6-DoF space.

Implementations of the devices described herein can provide advantages over conventional devices. For example, the devices described herein can use NLOS 6-DoF EM tracking while in range of a particular EM base and can automatically switch to tracking with a non-EM based sensor when out of range of the EM base. Such a switching mechanism can ensure that movements (and pose changes) of an input device may be tracked and transmitted regardless of range of the input device to a particular computing device. Users can move content in the computing device without loss of range errors and without loss of input device representation on the computing device. The handheld electronic device may be detected to be out of range of the computing device if a metric correlated with signal noise is above a noise threshold associated with the electromagnetic sensing system. For example, in one embodiment the EM tracking system is configured to provide acceptable tracking performance within a one meter range between the EM transmitter device and EM receiver device. Whenever the system detects that the range has exceeded one meter, for example, the system determines that the receiver is out of range of the transmitter. In another embodiment, the receiver is determined to be out of range of the transmitter when the signal-to-noise ratio of the received EM field falls below a threshold.

In some embodiments of the air mouse/input devices described herein, an EM tracking element may be used with (or instead of) an inertial measurement unit (IMU) sensor to provide absolute or relative pose tracking. In some implementations, the IMU sensor may be used in combination with the EM tracking element to provide for additional stability and tracking accuracy. Other input devices, dongles, buttons, and trackpads can be optionally added for additional input events. In addition, a number of software algorithms can be executed by the systems described herein to recognize pose trajectories for use with specific input gestures that may trigger commands on a computing device. For example, the systems described herein may convert detected pose trajectories into recognized gestures. The gestures may be interpreted as input commands by a system-associated computing device.

In the implementations described herein, the input devices include a number of example air mouse devices. In general, each air mouse device may house one or more sub-devices, one or more modules, and/or any number of mechanical and electrical components to provide a powered and functional portable input device. Other external enclosures may be rigidly, flexibly, and/or communicably attached to the air mouse devices.

FIG. 1 is a block diagram of an example pose tracking system 100, in accordance with implementations described herein. The system 100 may be utilized to perform positional tracking for one or more air mouse devices in use with one or more computing devices. The pose tracking system 100 may provide NLOS, 6-DoF tracking for any number of air mouse devices within range of a near-field electromagnetic field generated by system 100. The pose tracking system 100 may provide 3-DoF tracking for any number of air mouse devices out of range of the near-field electromagnetic field, but within communicable range of the computing device, for example.

In the example system 100, an air mouse device 102 can be moved by a user accessing content on a computing device 106 or mobile device 108, for example. Accessing content with the air mouse device 102 may include generating, modifying, moving and/or selecting the content shown within computing device 106.

A base device system 110 may detect the movement and/or pose change of the air mouse device 102 and can perform a number of calculations, determinations, and/or processes to determine the pose and any change in pose as the air mouse device 102 moves through 3D space. The pose may be used with any number of algorithms described herein to track the air mouse device 102 to properly move and render the content for display on computing device 106 and/or mobile device 108 over network 104, for example. In some implementations, the pose and other content may be used and/or transmitted directly from the air mouse device 102 without the use of the network 104. Similarly, the pose or other data may be transmitted from the base device 110 to device 106 and/or device 108 without the use of network 104. In some implementations, the devices of system 100 may communicate using point-to-point communication mechanisms (e.g., BLE, USB, etc.).

Once the pose of the air mouse device is computed relative to a base device system 110, the pose can be utilized in relative space with system 100. For example, if a user accesses the air mouse device 102 to manipulate 3D content 109 in a CAD program, a relative pose may be sufficient to allow tracking of device 102 as the user moves the content because the base device system 110 is likely stationary and the system would not benefit from additional calculations of translating the pose into world space. In some implementations, the pose can be translated to world space using the known pose of the base device system 110 in world space.

As shown in FIG. 1, the air mouse device 102 includes transmit coils and/or receive coils (e.g., transmitter/receiver coils 112), at least one processor (e.g., central processing unit (CPU) 114), at least one IMU sensor 118, one or more analog to digital convertors (ADCs) or one or more digital to analog converters (DACs) 120, and one or more amplifiers 122. In some implementations, the DACs 120 may be combined with one or more amplifiers 122, which may function to amplify as the signals are converted to analog signals. Other hardware and software may be present in system 100, for example, to communicate over additional wired or wireless protocols.

The base device system 110 includes transmitter/receiver coils 130, at least one CPU 132, memory 134, an ADC/DAC 136, and one or more amplifiers 138. Other hardware and software may be present in system 100, for example, to communicate over additional wired or wireless protocols.

Figure 2:
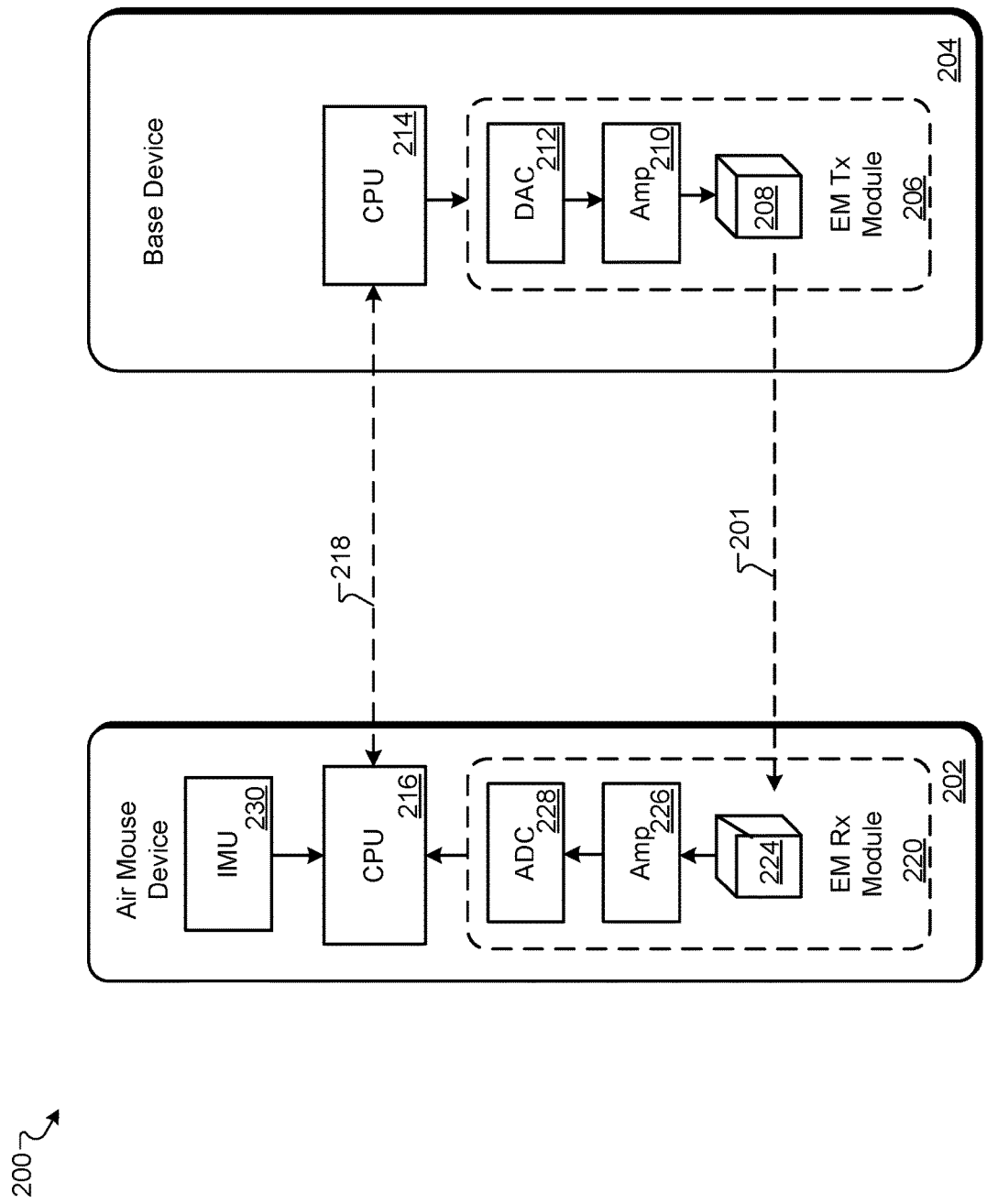
FIG. 2 is a block diagram of an example pose tracking system for an air mouse device, in accordance with implementations described herein.

The transmitter/receiver coils 112 and transmitter/receiver coils 130 may represent either transmitter coils or receiver coils that may respectively emit and/or sense EM fields (not shown). In general, an EM field may be generated by the base device system 110 using a transmitter coil. The air mouse device 102 may, using receiver coils, read EM data generated by the system 110. Other configurations are possible. For example, the EM field and data may be generated by the air mouse device 102 while the base device system 110 reads the EM data (as shown in FIG. 2).

In general, the pose tracking system 100 uses near-field electromagnetic fields to determine pose data associated with input devices, such as air mouse device 102. The pose data may be used to track the air mouse device 102 as a user moves the device (or when the device is stationary). In operation, the pose tracking system 100 may utilize at least one transmitter that generates an EM field on a tri-axis coil (e.g., transmitter coil(s) 112) to induce a current on a second tri-axis coil (e.g., receiver coil(s) 130) at a receiver (e.g., base device system 110). The receiver generates a number of readings which are then processed by system 110, for example, to compute a position and orientation of the transmitter (e.g., on air mouse device 102) relative to the receiver (e.g., on base device system 110).

In some implementations, an EM field may be generated by the system 110 using a transmitter coil 130 and the amplifier 138. For example, the transmitter coil 130 may be a tri-axis coil (e.g., three coils) that may generate three EM fields (one for each different axis). The EM field may be provided at a strength (i.e., transmit power) based on electrical power provided by the amplifier(s) 138 to the transmitter coil 130. The amplifier 138 may be a programmable amplifier generally configured to generate electrical power at a magnitude based on received control signaling. In general, the amplifiers 122 and 138 may function to amplify received signals.

Continuing with the above example, the air mouse device 102 may include components to read EM data. For example, device 102 includes receiver coils 112 and ADC 120. In some implementations, the receiver coil 112 is a tri-axis coil configured to generate an analog electrical signal having a magnitude and/or phase indicative of a detected EM field. The ADC 120 is generally configured to receive the generated analog signal and convert the analog signal to a digital value indicative of the analog signal of the detected EM field. In this example, the digital values generated by the ADC 120 represent EM data that can be used for pose identification, as described further below.

The air mouse device 102 may also include a processor 114, which may communicate, with processor 132 in the system 110. The communications may include relative pose data of the system 110 in relation to air mouse device 102 (or alternatively pose data of the device 102 in relation to system 110). Such processors 114 and 132 are configured to execute instructions (e.g., computer programs) in order to carry out specific tasks. In some implementations, at least one of the processors 114 and 132 executes instructions to identify a relative pose between the system 110 and the device 102 based on the EM data provided by the ADC 136. Memory 116 and memory 134 may be utilized throughout communications and interactions amongst system 110 and device 102.

The system 100 may be used to track 3D position and 3D orientation (i.e., 6-DoF tracking). The input devices may make use of an EM tracking system that is divided into a transmitter portion that produces EM fields and a receiver portion that senses EM fields. In one non-limiting example, the transmitter portion is housed on system 110 and includes transmitter coils 130, ADC 136, and amplifier 138. The transmitter portion may generate three fields on a tri-axis coil (not shown) while the receiver portion employs a tri-axis coil (not shown) as an antenna to sense the fields generated by the transmitter portion. The receiver portion may include receiver coils 112, ADC/DAC 120, and amplifiers 122. Each of the coils on the receiver portion may sense all three fields generated by the coils associated with the transmitter portion. This interaction results in at least nine EM measurements. Using these measurements, the pose of the receiver coils 112 relative to the transmitter coils 130 can be computed from the nine measurements by employing a dipole model (not shown) to equate sensed EM magnitudes (in the EM data) to a pose. As used herein, a pose may refer to a position, an orientation, or both.

In another non-limiting example, the transmitter portion is housed on device 102 and includes transmitter coils 112 and DAC 120, and amplifier 122. The transmitter portion may generate three fields on a tri-axis coil while the receiver portion employs a tri-axis coil (e.g., coils 112) as an antenna to sense the fields generated by the transmitter portion. The receiver portion may be housed on system 110 and may include receiver coils 130, ADC/DAC 136, and amplifiers 138. Each of the coils on the receiver portion may sense all three fields generated by the coils associated with the transmitter portion. This interaction results in at least nine EM measurements. Using these measurements, the pose of the receiver coils 130 relative to the transmitter coils 112 can be computed from the nine measurements by employing a dipole model (not shown) to equate sensed EM magnitudes (in the EM data) to a pose.

As shown in FIG. 1, the air mouse device 102 may also include an IMU sensor 118. The IMU sensor 118 may function to detect, for the air mouse device, a 3D orientation in 3D space based on the IMU measurements. The IMU sensor 118 may include one or more accelerometers, gyroscopes, magnetometers, and other such sensors. In general, the IMU sensor 118 may detect motion, movement, velocity, and/or acceleration of the air mouse device 102, for example.

In some implementations, a pose of the air mouse device 102, for example, may be detected based on data provided by the IMU sensor 118. Based on the detected pose, the system 100 may update content on a computing device 106 (or base device 110) to reflect a changed pose of the air mouse device 102.

As used herein, the term transmitter/receiver may represent a single transmitter, a single receiver, a transmitter and a receiver (e.g., a transceiver), multiple transmitters, or multiple receivers. In some implementations, the transmitter (TX) and receiver (RX) are distributed over different devices, including a stationary base device (e.g., associated or within computing device 106) that tracks the position and/or orientation of a movable input device. In some implementations, the base device system 110 may include transmitter coils while the air mouse device 102 may include receiver coils. In some implementations, the base device system 110 may include receiver coils while the air mouse device 102 may include transmitter coils. In some implementations, either or both devices 102, 110 may include transceivers that may transmit and receive depending upon which EM field excites coils of the respective transceiver.

In some implementations, the base device system 110 is connected to computing device 106 and/or mobile device 108. For example, the base device system 110 may be rigidly connected to computing device 106 and/or mobile device 108. In some examples, the base device system 110 may be communicably coupled to (e.g., wired or wirelessly) computing device 106 and/or mobile device 108. In some examples, the base device system 110 may be a dongle coupled to computing device 106 and/or mobile device 108 and may communicate with air mouse device 102 via the dongle. In some implementations, the base device system 110 is housed within computing device 106 or mobile device 108.

In the example system 100, the devices 106, 108, and 110 may be (or may be part of) a laptop computer, a desktop computer, a mobile computing device, a tablet computing device, or a gaming console. Devices 106, 108, and 110 can include hardware and/or software for executing applications and application content. In addition, devices 106, 108, and 110 can include (or have access to) hardware and/or software that can recognize, monitor, and track a pose of the air mouse device 102, when these devices are placed in front of or held within a range of positions relative to the air mouse device 102. In some implementations, devices 106, 108, and 110 can provide additional content to air mouse device 102 over network 104. In some implementations, devices 102, 106, 108, and 110 can be connected to/interfaced with one or more of each other either paired or connected through network 104. The connection can be wired or wireless. The network 104 can be a public communications network or a private communications network.

The system 100 may include or have access to electronic storage (e.g., memory 116 and memory 134). The electronic storage can include non-transitory storage media that electronically stores information. The electronic storage may be configured to store captured pose data, raw sensor data, application data, and/or other computing data.

In some implementations, the base device system 110 may be integrated with the computing device 106 which may include (or be coupled to) a dongle 140, as described in detail with respect to FIG. 7 below. In some implementations, the air mouse device 102 may include a trackball 142, as described in detail with respect to FIGS. 6A-6B below.

In some implementations, the air mouse device 102 may include a communications module 144. The communications module 144 may be used to transmit data to CPU 114 or other devices in system 100. In some implementations, the communications module 144 may transmit commands to manipulate content 109 in device 106 based on movements and/or pose changes detected from air mouse device 102. Although communication modules are not explicitly depicted for computing devices 108, 106, and for base device system 110, each of these devices may have the ability to send and receive messages, data, commands, and the like amongst any of the devices of system 100.

In some implementations, the air mouse device 102 includes a gesture module 146. In some implementations, the base device 110 instead includes the gesture module 146. In yet other implementations, the computing device 106 includes the gesture module 146. The gesture module 146 represents algorithms and/or software that can convert pose trajectories into recognized gestures. The pose trajectories may be generated by a user accessing air mouse device 102. The gestures may be interpreted as input commands by an associated computing device 106 housing system 100, for example. In some implementations, a pose of the air mouse device may control a two dimensional (2D) mouse cursor on an associated computing device 106. The mouse cursor may be moved by either translating the air mouse device 102 or changing the pointing angle of the air mouse device 102.

Figure 7:
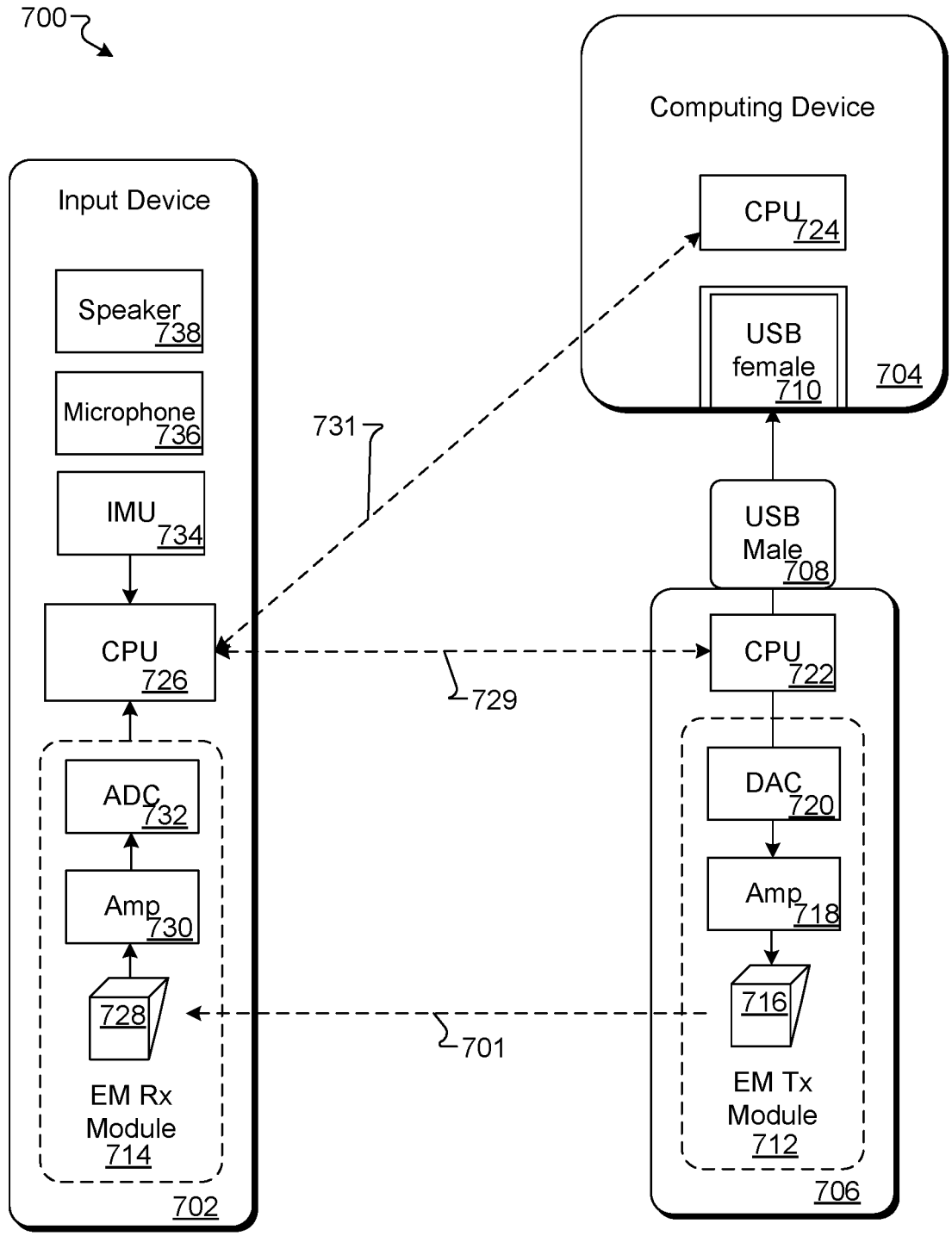
FIG. 7 is a block diagram of an example pose tracking system, in accordance with implementations described herein.

In some implementations, the air mouse device 102 includes a microphone (not shown) and/or a speaker (not shown), as described in detail with respect to FIG. 7.

FIG. 2 is a block diagram of an example pose tracking system 200 for an air mouse device 202, in accordance with implementations described herein. The tracking system 200 may be an EM tracking system that utilizes transmitter coils and receiver coils to perform tracking of the air mouse device 202. In some implementations, the pose tracking system 200 may include non-electromagnetic sensors and devices to assist in tracking of the air mouse device 202, as a user moves the device 202 to interact with content in a computing device (associated with or integrated with a base device 204).

As shown in this example, the system 200 includes an input device (e.g., air mouse device 202) and a base device 204. The air mouse device 202 may be a handheld electronic device for controlling 3D content displayed in a user interface of a computing device. For example, the device 202 may be an air mouse device 102 for use with content 109 on computing device 106 in which base device system 110 is installed on (or accessible to) computing device 106.

The tracking system 200 is generally configured to identify relative poses between the air mouse device 202 and the base device 204 by generating an EM field 201, measuring a magnitude and/or phase of the generated EM field 201 (referred to herein generally as "EM data"), and computing a relative pose based on the corresponding EM data. The tracking system 200 can therefore be incorporated into a variety of devices and systems that employ pose identification algorithms. In some implementations, a portion of the tracking system 200 is incorporated into an air mouse device while other portions of the tracking system 200 are incorporated into a computing device. Thus, in some configurations, the base device 204 is a computing device (e.g., base device system 110, computing device 106, or mobile device 108) while the input device is a handheld air mouse device 102/202. In some configurations, the base device 204 is the input device while the air mouse device 202 is a stationary computing device (e.g., base device system 110, computing device 106, or mobile device 108). Other configurations are possible, including an EM field that is generated by device 202 to ensure that EM data may be read at the base device 204.

In operation of system 200, an EM field 201 is generated by the base device 204. The base device 204 includes an EM transmitter module 206 to generate the EM fields. The EM transmitter module 206 includes a transmitter coil 208, an amplifier 210, and a DAC 212. The transmitter coil 208 may represent, for example, a tri-axis coil configured to generate the EM field 201 at a particular strength (e.g., transmit power). The transmit power may be based at least in part on the electrical power provided by the amplifier 210. The amplifier 210 may be configured to generate the electrical power at a magnitude based on received control signaling of device 204.

In response to detecting the generated EM field 201, the air mouse device 202 reads EM data from the EM field 201 using an onboard EM receiver module 220. In general, the EM transmitter module 206 may function as a portion of an electromagnetic sensing system for detecting poses associated with the air mouse device 202, for example. The air mouse device 202 may include a remaining portion of the electromagnetic sensing system in an EM receiver module, as described with respect to EM receiver module 220. In some implementations, the EM receiver module includes one or more processors (not shown).

The base device 204 includes a CPU (i.e., processor 214) that may bi-directionally communicate with air mouse device 202 via communication link 218. For example, EM data, identified poses, identified pose trajectories, and/or other information may be exchanged between air mouse device 202 and base device 204. For example, in some implementations, the processor 216 identifies poses based on the EM data and communicates the identified poses to the processor 214. In some implementations, the processor 216 communicates the EM data to the processor 214, which identifies poses based on the EM data.

The communication link 218 can be a wired communication link (e.g., USB, serial, Ethernet, etc.), a wireless communication link (e.g., Bluetooth, WiFi, ZigBee, RF, etc.), and the like, or a combination thereof. In other embodiments, the EM data can be sent to another device and/or processor (not shown) and the other device and/or processor may compute a pose from the EM data. In some implementations, the EM data may be stored locally within device 202 or 204, locally within the system 200, and/or remote from system 200.

As shown in FIG. 2, the air mouse device 202 is an input device that includes an EM receiver module 220 to generate EM data from detected EM fields. The EM receiver module 220 includes a receiver coil 224, an amplifier 226, and an ADC 228. In some implementations, the receiver coil 224 may be a tri-axis coil configured to detect an analog electrical signal having a magnitude and/or phase indicative of a particular detected EM field. The ADC 228 may be configured to receive the generated analog signal and convert the analog signal to a digital value indicative of the analog signal represented in the EM field 201. The digital values generated by the ADC 228 are EM data that can be used for pose identification for air mouse device 202.

The air mouse device 202 also includes an IMU sensor 230. The IMU sensor 230 may provide additional pose information about device 202. One or more of the processors 214 and 216 (or another device processor) can use the additional pose information to supplement or augment the poses identified based on the EM data. For example, in some embodiments the processor 216 can use the additional pose information to identify potential errors in the poses determined based on the EM data, and to address the identified errors.

In some implementations, the processor 216 may use the additional pose information determined using IMU 230 to track air mouse device 202, for example, when device 202 is out of range of the EM field produced by transmitter module 206. Thus, the IMU 230 may be utilized as a backup pose determiner in order to continue tracking the device 202. For example, if device 202 is the air mouse device 102 and the user operating device 102 moves out of range of base device 204 (e.g., installed within computing device 106), the system 200 can still determine pose information well enough to track a moving device 102 such that content (e.g., 3D objects) within the computing device 106 can be moved based on movements of tracked air mouse device 102. In this example, the pose information may be 3-DoF pose data based on detected 3D orientations of the device 102/202.

If the IMU 230 is utilized as a backup pose determiner, the systems described herein may include one or more processors (e.g., processor 216 on device 202) that are configured to generate commands to manipulate 3D content in the computing device 106, for example. In some implementations, the IMU may generate commands using the 6-DoF pose to manipulate 3D content displayed on the computing device, in response to detecting air mouse poses while the air mouse device is communicably coupled to the electromagnetic transmitter. To do so, the systems described herein may begin to use pose information gathered from IMU 230 (instead of from the EM sensing system including both transmitter module 206 and receiver module 220). The pose information may be used to track movement of air mouse device 202. The movements may be converted into commands that may be carried out on the content 109 shown in the user interface of computing device 106, for example.

In some implementations, the commands may be generated based on a determined proximity of the air mouse device (e.g., air mouse device 102) relative to a base device (e.g., base device 204). The base device 204 may be associated with (or in communication with) the computing device 106, for example. The determined proximity may be an indication that the air mouse device 102 is in or out of range of the base device 204 (and/or computing device 106, if the transform between the base device 204 and the computing device 106 can be estimated). The determined proximity may trigger selection of which particular data to use when generating the commands. For example, the system 200 may utilize data (e.g., pose data) from the electromagnetic sensing system when the determined proximity indicates that the device 102 is within range of the base device 204. The system 200 may instead utilize pose data from the IMU 230 (e.g., three-dimensional orientation) when the determined proximity indicates that the device 102 is out of range of the base device 204 and/or computing device 106.

Upon generation of one or more commands, a communication module 144 may access CPU 216 to trigger transmission of the one or more commands to manipulate the three-dimensional content displayed in the computing device.

Figure 3:
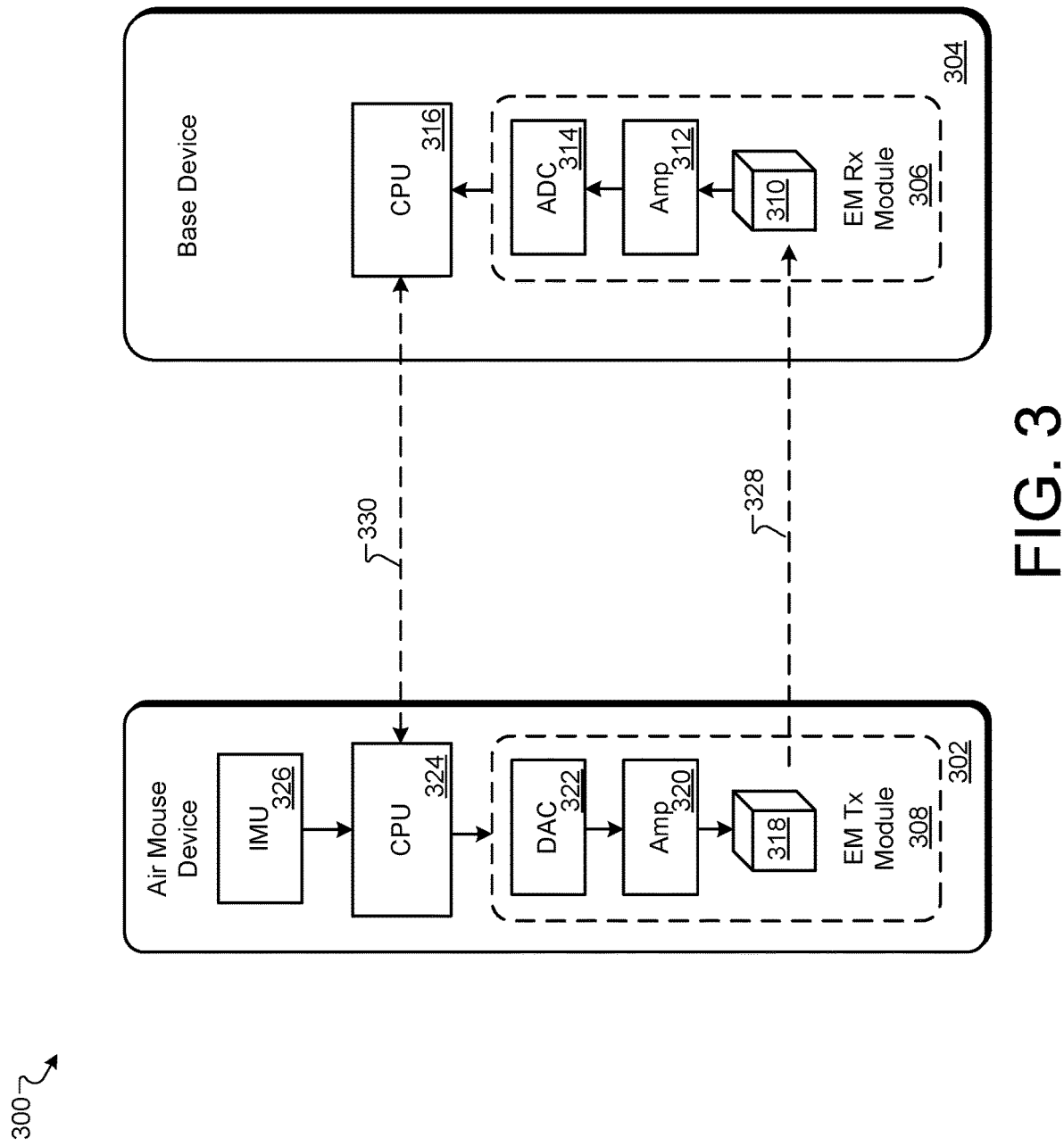
FIG. 3 is a block diagram of another example tracking system for an air mouse device, in accordance with implementations described herein.

FIG. 3 is a block diagram of another example pose tracking system for an air mouse device 302, in accordance with implementations described herein. Similar to the pose tracking system 200, system 300 may be an EM tracking system that utilizes transmitter coils and receiver coils to perform tracking of the air mouse device 302. In some implementations, the pose tracking system 300 may include non-electromagnetic sensors and devices to assist in tracking of the air mouse device 302, as a user moves the air mouse device 302 to interact with content in a computing device (e.g., computing device 106) associated a base device 304.

The pose tracking system 300 is similar to the pose tracking system 200 of FIG. 2, but the pose tracking system 300 places an EM receiver module 306 at the base device 304 and an EM transmitter module 308 at the air mouse device 302. For example, as shown in FIG. 3, the base device 304 includes the EM receiver module 306 with a receiver coil 310, an amplifier 312, and an ADC 314. The base device also includes a processor 316.

The input device 302 includes the EM transmitter module 308 to generate EM fields which are sensed at the base device 304. The EM transmitter module 308 includes a transmitter coil 318, an amplifier 320, and a DAC 322. In some implementations, the transmitter coil 318 is a tri-axis coil configured to function with the DAC 322 and amplifier 320 to generate an analog electromagnetic field.

The air mouse device 302 also includes an IMU sensor 326. The IMU sensor 326 may provide additional pose information about device 302. One or more of the processors 316 and 324 (or another device processor) can use the additional pose information to supplement or augment the poses identified based on the EM data. For example, in some embodiments the processor 326 can use the additional pose information to identify potential errors in the poses determined based on the EM data, and to address the identified errors.

In some implementations, the processor 316 (or processor 324 or another device processor) may use the additional pose information determined using IMU 326 to track air mouse device 302, for example, when device 302 is out of range of the EM fields described herein. Thus, if the device 302 is an air mouse device 102 and the user operating the device 102 moves out of range of base device 304 (e.g., installed within computing device 106), the system 300 can still determine pose information well enough to track a moving air mouse device 102 such that content (e.g., 3D objects) within the computing device 106 can be moved based on movements of tracked air mouse device 102.

In operation of system 300, the EM transmit module 308 is configured to generate EM field 328. The EM receiver module 304 is configured to generate EM data from the sensed EM field 328. In some implementations, IMU data from the air mouse may be transmitted via a communication link 330 from processor 324 to processor 316. In some implementations, the EM data can be used to identify relative poses between the base device 304 and the device 302. Similarly, the IMU data may be used to identify poses of the air mouse device 302.

Figure 4:
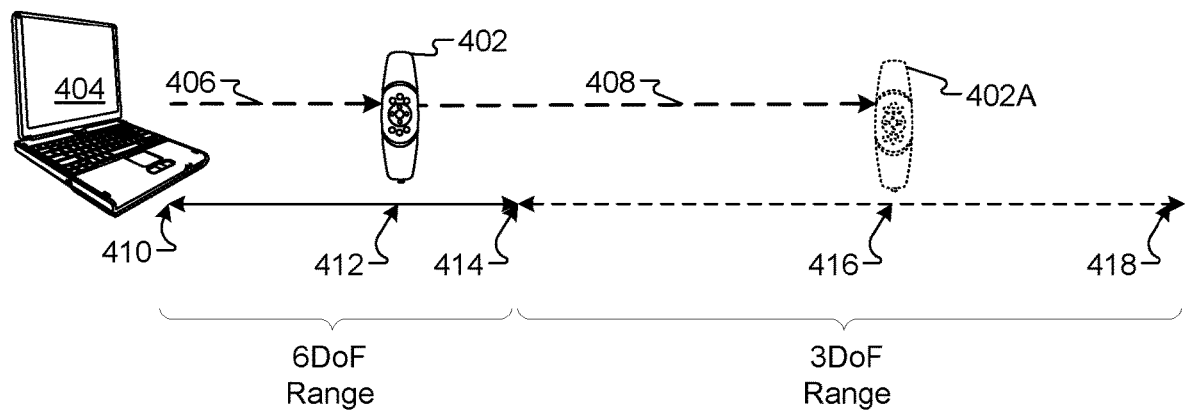
FIG. 4 is a block diagram depicting an example range of tracking for use with one or more air mouse devices described herein.

FIG. 4 is a block diagram depicting an example range of tracking for use with one or more air mouse devices described herein. In the depicted example, an air mouse device 402 is shown a distance from computing device 404. The air mouse device 402 may be used to modify 3D content in the display of computing device 404. The air mouse device 402 may represent air mouse device 102 (FIG. 1) while computing device 404 may represent computing device 106 housing system 110.

In operation, the air mouse 402 may be moved away from a computing device 404 that houses receiver circuitry and/or transmitter circuitry for determining pose information which may be used to track device 402. For example, a user may operate device 402 to move the device (from 402 to 402A) to manipulate 3D content in device 404. Here, the user has moved device 402 away from the computing device 404, as indicated by arrows 406 and 408. The device is illustrated as moving in a straight line, but any route of movement may be possible. The line from position 410 through position 418 is intended to illustrate a particular distance over which device 402 functions may change based on a distance away from device 404. For example, since air mouse device 402 includes EM-based circuitry, moving device 402 from a particular antenna (i.e., coils) within device 404 can cause signal decay and signal failure if the device 402 travels beyond a system-defined operating distance from the computing device 404. In particular, noise may increase as the distance is increased between a receiver module (e.g., receiver module 220) and a transmitter module (e.g., transmitter module 206). Elevated noise may cause signal failure or an inability to utilize data from either device 402, 404.

The systems described herein can detect when a particular receiver module is out of range of a particular transmitter module. That is, when the noise (or a metric that is correlated to noise, such as distance) between the receiver and the transmitter is greater than a threshold, the systems described herein may fall back to 3-DoF pose estimation and subsequent device tracking. In some implementations, the threshold may be a predefined threshold based on the hardware used in the system, and in other implementations, the threshold is dynamically computed. In some examples, the threshold might be set at a distance between the transmitter and the receiver that allows for pose determination, but may be a large enough distance to induce noise effects that cause signal degradation and/or data transmit failure. In either event, if a particular receiver is detected as being out of range of a transmitter, the system may rely on a secondary sensor (e.g., IMU sensor 118) to provide 3-DoF tracking until the transmitter and receiver are detected to be within range again. In one example, once the air mouse device 402 is detected within range of the computing device 404 (housing base device system 110), the EM tracking system 100 may return to performing 6-DoF pose tracking.

As shown in FIG. 4, if the user moves air mouse device 402 from location 410 to a distance represented by location 412 or location 414 (within the 6-DoF range), the EM-based pose determination and device tracking may be performed by system 100. The maximum distance may be represented by device electronics and power protocols used. In an example operation of device 402, about one meter may be represented from location 410 to location 414. However, such distances may be programmable smaller or larger than about one meter.

If the device 402 is moved beyond location 414, for example to location 416 or 418 (e.g., within the 3-DoF range), the system 100 can revert to using IMU sensor 118 to perform 3-DoF pose determination and device tracking. If the air mouse device 402 is returned to location 414 or otherwise placed within range of device 404 (housing an EM transmitter/receiver device), for example, the system 100 can use the 6-DoF (EM-based) pose determination and device tracking.

In some implementations, an example air mouse tracking system may include a handheld air mouse device and a host computing device. The handheld air mouse device may include an IMU, a first processor, and either an EM receiver device or an EM transmitter device. The host computing device may include an EM receiver if the handheld air mouse device includes an EM transmitter device. The host computing device may include an EM transmitter device if the handheld air mouse device includes an EM receiver device. The host computing device may also include a display and a second processor in communication with the first processor. The first processor may be configured to collect pose data derived from EM data and/or IMU data. The pose data may be used to compute (by the first processor or the second processor) an estimated pose between the EM receiver and EM transmitter modules. The pose may be used to generate commands to manipulate three-dimensional content in the computing device.

In some implementations, the EM receiver device or the EM transmitter device may be in a base device that contains a third processor and is external to the host computing device. Estimated poses may be computed by a single processor or any combination of the first processor, the second processor, and/or the third processor. In some implementations, the estimated pose is a 6-DoF pose computed from the EM data when a metric correlated with the noise in the EM data is below a threshold. The estimated pose is a 3-DoF pose computed from the IMU data when the metric is above the threshold.

In another example, a handheld electronic device is described for controlling three-dimensional content displayed in a user interface of a computing device. The handheld electronic device may include an EM receiver module, an IMU, a first communications link, and at least one processor. The at least one processor may be configured to collect EM data from the EM receiver module, collect IMU data from the IMU, and transmit pose data over the first communications link, where the pose data is derived from EM data and/or IMU data and where the pose data is used to estimate a pose of the handheld electronic device. In addition, the pose may be used to generate commands to manipulate the three-dimensional content in the computing device.

In some implementations, the transmitter is housed within the computing device. In some implementations, the transmitter is embedded in a dongle plugged into the computing device. In some implementations, the dongle includes a second communications module that maintains a communications link with the first communications module, receives pose data from the handheld electronic device over the communications link, and forwards data derived from the pose data to the computing device over USB. In some implementations, the transmitter module is instead housed in the air mouse device while the receiver is housed within the computing device.

Figure 5A:
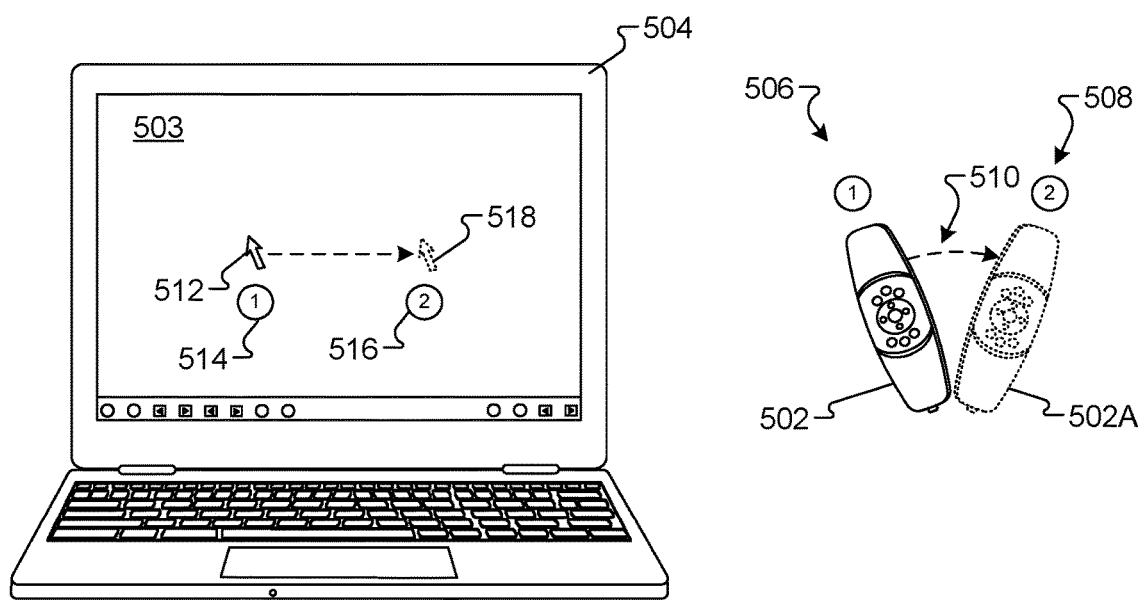
FIGS. 5A-5C are block diagrams depicting example gesture recognition for use with one or more air mouse devices described herein.
Figure 5B:
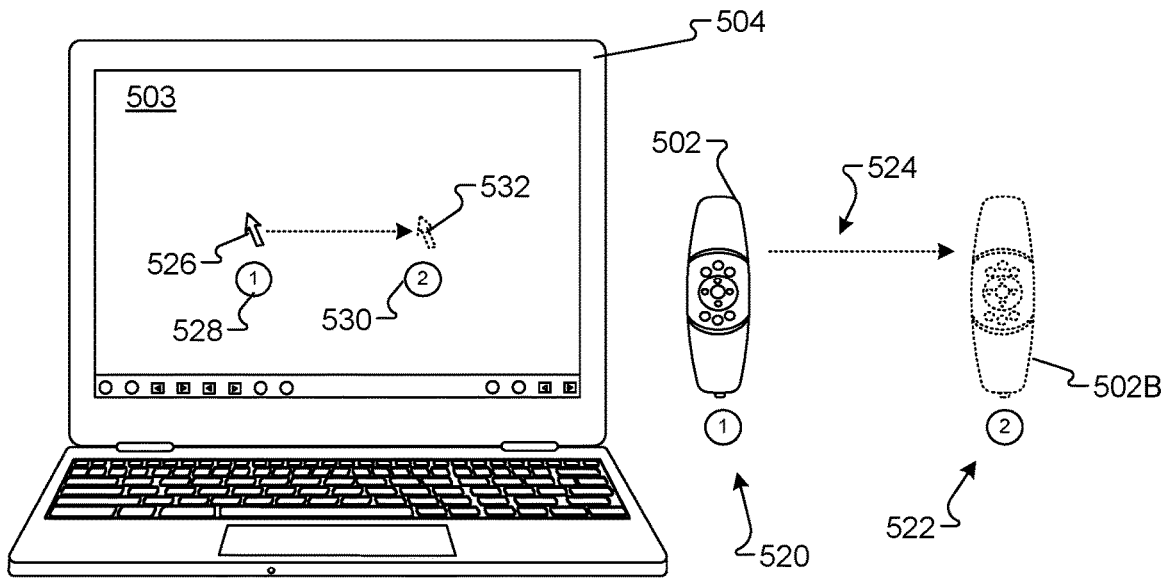
Figure 5C:
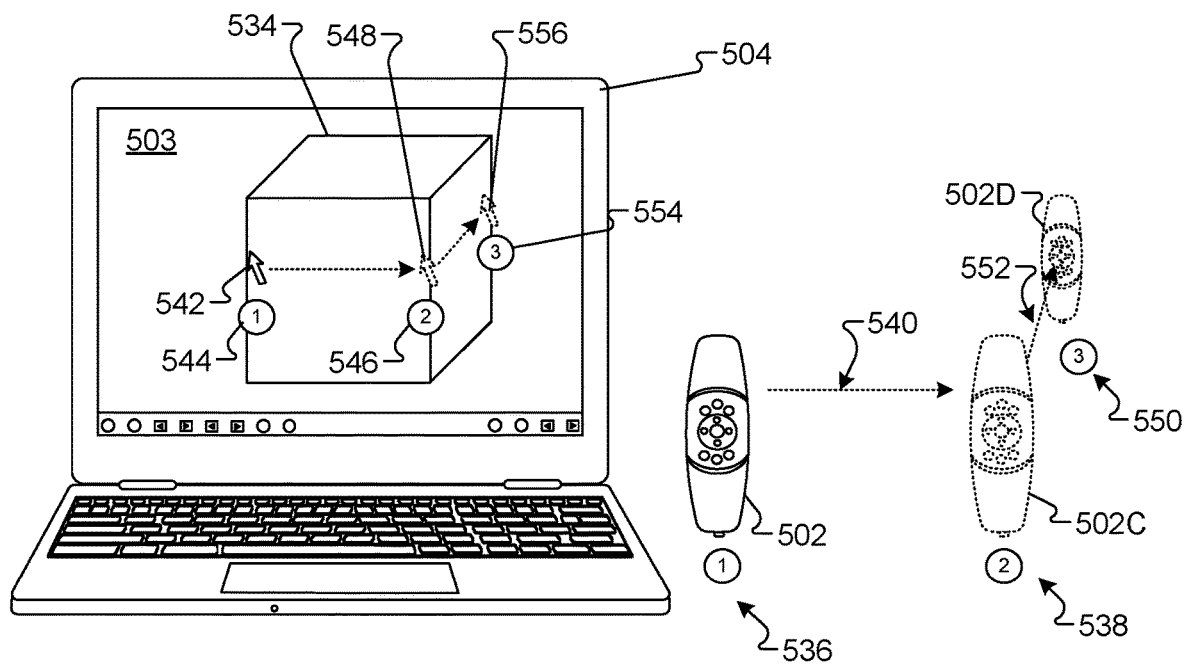

FIGS. 5A-5C are block diagrams depicting example gesture recognition for use with one or more air mouse devices described herein. The air mouse device 502 may be described with respect to similar device 102, device 202, or device 302. Gesture recognition may be carried out by the gesture module within the air mouse device (e.g., gesture module 146 in air mouse device 102), the base device 110, or the computing device 106. The gesture module includes algorithms and/or software that can convert pose trajectories determined for the air mouse device into recognized gestures. The pose trajectories may be generated by a user accessing air mouse device 102. The gestures may be interpreted as input commands by an associated computing device 106 housing system 100, for example. In some implementations, a pose of the air mouse device may control a two dimensional (2D) mouse pointer on an associated computing device 106. In general, the mouse pointer may be moved by either translating the air mouse device 102 or changing the pointing angle of the air mouse device 102.

As shown in FIG. 5A, a user may be using an air mouse device 502 to access software and content in a user interface 503 in a computing device 504. The air mouse device 502 may be moved at an angle to cause a proportional change in the position of a 2D mouse cursor.

For example, a user may perform an arc movement with device 502 from position [1] 506 to position [2] 508, as shown by device 502A at arrow 510. In response, the system 100 may use pose information obtained from EM-based tracking system (split between system 110 and device 102) to accurately move a mouse pointer 512 a proportional distance from a left position [1] 514 to a right position [2] 516 in the user interface 503, resulting in the mouse pointer being shown by mouse pointer 518. That is, if the air mouse device 502 is moved with the angle change shown by arrow 510, the mouse pointer 512 is also moved from left to right for a distance proportional to the angle change.

As shown in FIG. 5B, a user may be using the air mouse device 502 to access software and content in the user interface 503 in the computing device 504. The air mouse device 502 may be moved from left to right to cause a proportional change in the position of a 2D mouse cursor.

For example, a user may perform a left to right movement with device 502 (to 502B) from position [1] 520 to position [2] 522, as shown by device 502B at arrow 524. In response, the system 100 may use pose information obtained from EM-based tracking system (e.g., split between system 110 and device 102) to accurately move a mouse pointer 526 a proportional distance from a left position [1] 528 to a right position [2] 530 in the user interface 503, resulting in the mouse pointer being shown by mouse pointer 532. That is, if the air mouse device 502 is moved as shown by arrow 524, the mouse pointer 526 is also moved from left to right for a distance proportional to the translation change. Thus, the mouse pointer position change is proportional to the position of the air mouse device in 3D space.

As shown in FIG. 5C, a user may be using the air mouse device 502 to access software and 3D content 534 in the user interface 503 in the computing device 504. The air mouse device 502 may be moved from left to right and forward in space to cause a proportional change in the position of a 2D or 3D mouse cursor configured to move in the virtual space displayed on a computing device.

For example, a user may perform a left to right movement with device 502 (to 502C) from position [1] 536 to position [2] 538, as shown by device 502C at arrow 540. In response, the system 100 may use pose information obtained from EM-based tracking system (e.g., split between system 110 and device 102) to accurately move a mouse pointer 542 a proportional distance from a left position [1] 544 to a right position [2] 546 in the user interface 503, resulting in the mouse pointer being shown by mouse pointer 548. Thus, the mouse pointer position change is proportional to the position of the air mouse device in 3D space.

Similarly, the user may perform a front to back (i.e., forward) movement in 3D space with device 502 (to 502D) from position [2] 538 to position [3] 550, as shown by device 502D at arrow 552. In response, the system 100 may use pose information obtained from EM-based tracking system (e.g., split between system 110 and device 102) to accurately move the mouse pointer 548 a proportional distance from the first position [2] 546 to a second position [2] 554 in the user interface 503, resulting in the mouse pointer being shown by mouse pointer 556. Thus, the mouse pointer position change is proportional to the position of the air mouse device in virtual 3D space by moving the air mouse device in 3D space.

In some implementations, the system 100 can capture and interpret complex gestures. For example, such gestures may be captured and interpreted as commands to the associated computing device 106 housing system 110, for example. One example gesture may include a user shaking the air mouse device 502 left to right back and forth. The system 100 may interpret the movements as a command to close the current operating system/application window. In another example, a gesture may include pressing a button and pointing the air mouse device 502 downward to trigger the system 100 to cause a window focused in interface 503 to scroll downward. In yet another example, gesture may include using the device 502 to enter, as input, a letter (e.g., "x") in the air (e.g., 3D space). Such a gesture may result in the system 100 interpreting the gesture as a command to close the window. Each of these example gestures may be interpreted and transmitted as commands (e.g., via communication module 144) to a software application and/or operating system on the computing device 106. The gestures may be interpreted by gesture module 146 utilizing any EM-based sensors and/or components and non-EM based sensors and/or components described in FIG. 1 and/or systems throughout this disclosure.

In some implementations, the systems described herein may capture and interpret gestures as commands to a computing system in a 3D context. In particular, system 100 may capture and interpret gestures as commands in a 3D context. For example, the 3D object 534 may be displayed on the computing device 504. The system 100 may determine that the user wishes to interact with content 534 based on contextual cues. If system 100 determines that the user has some context with 3D object 534, the system 100 may lock the motion of the air mouse device 502 to the 3D object 534 such that performing movements with device 502 causes one to one movements of the 3D object 534. For example, pulling the air mouse device 502 backward (not shown) may cause the 3D object 534 to appear larger and closer in the user interface 503, effectively zooming in on the 3D object 534. Similarly, a gesture that includes rotating the air mouse device 502 in the air may cause a corresponding rotation of the 3D object 534 in the user interface 503. In another example, the use of two air mouse devices (e.g., one device 502 in each of a left hand and a right hand) may allow a user to intuitively grab (e.g., naturally handle) the 3D object 534 and pull or stretch the object. The system 100 may effectively simulate grabbing a first end and a second end, respectively, using the left air mouse device 502 to simulate handling the first end, and using the right air mouse device 502 to simulate handling the second end.

Figure 6B:
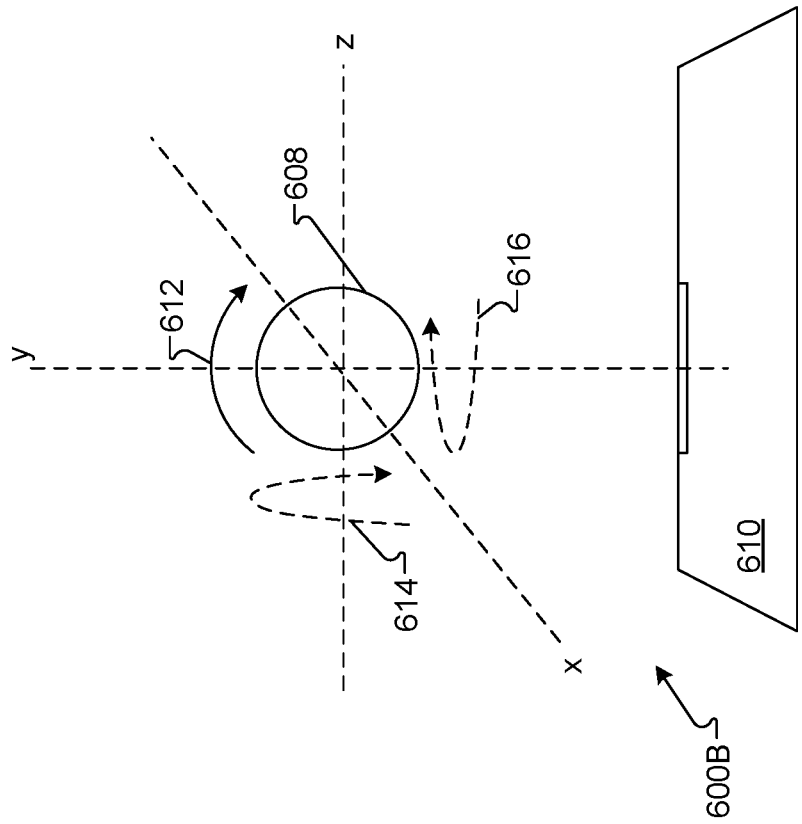
FIGS. 6A-6B are block diagrams depicting an example air mouse device, in accordance with implementations described herein.
Figure 6A:
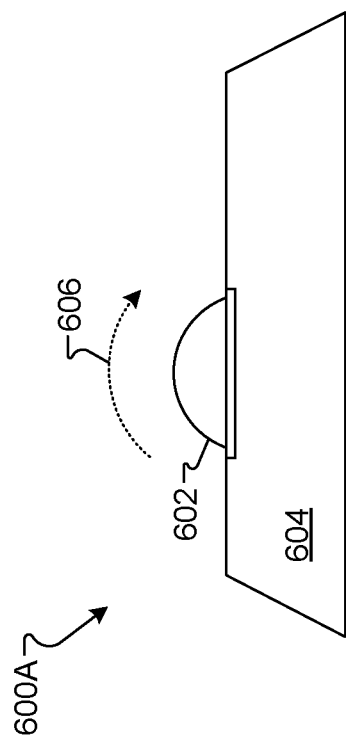

FIG. 6A is a block diagram depicting an example air mouse device 600A in accordance with implementations described herein. The air mouse device 600A may control a 2D pointer in a computing device by rolling a trackball 602 over a trackpad 604. For example, the air mouse device 600A may be accessed by a user to move the content 109 on computing device 106 (FIG. 1) in two dimensions as the user rolls the trackball 602 around the trackpad 604. If the user rolls trackball 602 rightward, as shown by arrow 606, the content 109 may be moved left to right. In this example, the trackball 602 may provide pose information and commands may be generated in response to the pose information.

FIG. 6B is a block diagram depicting an example 3D air mouse device 600B in accordance with implementations described herein. The air mouse device 600B is removable from trackpad 610. The air mouse device 600B may control 3D virtual objects in a computing device by lifting a trackball 608 from trackpad 610 and moving the trackball 608 in 3D space (e.g., the x-y-z axis in FIG. 6B). For example, a user may lift trackball 608 and turn the ball rightward (or leftward) from a perpendicular y, as shown by arrow 612. Such a movement may tilt content 109 (FIG. 1) at any angle that the user may choose when twisting and/or turning the trackball 608. Similarly, the user may manipulate content 109 to twist the content backward (or forward) from a horizontal z, as indicated by arrow 614. In addition, the user may rotate the trackball in 3D space around the y-axis, for example, as indicated by arrow 616. Using the tracking EM-based systems described herein, the rotation of the trackball 608 triggers rotation of the content 109 (e.g., a three-dimensional object) displayed in a computing device. Similarly, translating the trackball 608 in space causes a proportional translation of the content 109 in virtual space shown in a UI of the computing device.

The user may move trackball 608 left, right, up, down, forward, and backward including tilting, rotating, revolving movements to affect the movement of content 109, for example, in 3D space. The movement may be a one to one movement where a user moves the trackball in space and the content 109 is moved the same distance in the computing device (or moved a predetermined proportional distance based on the physical movement of the trackball 608).

In general, the trackball 608 may provide pose information and commands may be generated in response to the pose information. Such commands may manipulate, control, or otherwise modify the content 109 in the computing device. To function in system 100, the trackball may include at least one transmitter module (e.g., transmitter module 308) to transmit commands to control a three-dimensional object (e.g., content 109) according to movements of the trackball 608 in 3D space. In some implementations, the trackball may instead include at least one receiver module while a base computing device includes the transmitter module.

In some implementations, the input devices described herein include one or more buttons that provide for an additional input events. Additionally the input devices can incorporate any or all of a slider, one dimensional (1D) touchpad, a roller, or similar component that allows for additional 1D input. In some implementations, the input devices described herein can include a 2D touchpad, a joystick, and/or similar component that allows for 2D analog input into the respective input device.

FIG. 7 is a block diagram of an example pose tracking system 700, in accordance with implementations described herein. The pose tracking system 700 may include an input device 702 and a computing device 704 removably attachable to a dongle 706. The dongle 706 may include components similar to components in the base device 204 (FIG. 2) or 304 (FIG. 3). The input device 702 may be a handheld electronic device for controlling 3D content displayed in a user interface (not shown) of computing device 704. For example, the device 702 may be an input device 102 for use with content 109 on computing device 106 in which base device system 110 is installed on, connected to, or otherwise accessible to computing device 106.

In the depicted example, the dongle 706 may include a USB connector 708 that may be mated with the computing device 704 by a connector 710. In general, the input device 702 may be a handheld device such as a controller, an air mouse, a mobile device, or a tablet device, etc. The input device 702 may be configured to communicate pose information to the dongle 706 via a first wireless protocol (e.g., via radio frequency, Wi-Fi, or other wireless signal in the electromagnetic spectrum). The dongle 706 may communicate to the computing device 704 using a wired protocol such as Universal Serial Bus (USB), ZigBee, serial, firewire, thunderbolt, lightning, analog audio, digital audio, and the like. In some implementations, the dongle 706 includes an EM transmitter module 712 to interface (and/or communicate) with an EM receiver module 714 associated with the input device 702. Although a USB interface for the dongle 706 is depicted and may provide both a reliable mechanical interface as well as digital communication protocol in a small form factor, any other interface (such as ZigBee, serial, firewire, thunderbolt, lightning, analog audio, digital audio, etc.) could be used in any of the devices described herein.

The tracking system 700 may be an EM tracking system that utilizes transmitter coils and receiver coils to perform tracking of the input device 702. In some implementations, the pose tracking system 700 may include non-electromagnetic sensors and devices to assist in tracking of the input device 702, as a user moves the device 702 to interact with content in a computing device (associated with or integrated with the computing device 704 connected to dongle 706).

In some implementations, the EM transmitter module 712 is instead in the input device 702 and the EM receiver module 714 is swapped to the dongle 706. In this implementation of the system, the EM data may be collected at the dongle and may be converted to poses by the CPU 722 in the dongle 706 or by the CPU 724 in the computing device 704.

The tracking system 700 is generally configured to identify relative poses between the input device 702 and the base device (e.g., dongle 706) by generating an EM field 701, measuring a magnitude and/or phase of the generated EM field 701 (referred to herein generally as "EM data"), and computing a relative pose based on the corresponding EM data. Other configurations are possible, including an EM field that is generated by device 702 to ensure that EM data may be read at the base computing device 704 (via dongle 706, for example).

In operation of system 700, an EM field 701 is generated by the dongle 706. The dongle 706 includes the EM transmitter module 712 to generate the EM fields. The EM transmitter module 712 includes a transmitter coil 716, an amplifier 718, and a DAC 720. The transmitter coil 716 may represent, for example, a tri-axis coil configured to generate the EM field 701 at a particular strength (e.g., transmit power). The transmit power may be based at least in part on the electrical power provided by the amplifier 718. The amplifier 718 is configured to generate the electrical power at a magnitude based on received control signaling of device 706.

In response to detecting the generated EM field 701, the input device 702 reads EM data from the EM field 701 using the onboard EM receiver module 714. In general, the EM receiver module 714 may function as a portion of an electromagnetic sensing system for detecting 3D positions and/or 3D orientations (i.e., poses) associated with the input device 702, for example. In this example, the dongle 706 may include a remaining portion of the electromagnetic sensing system in an EM transmitter module 712. In some implementations, the EM receiver module 714 may function as a portion of an electromagnetic sensing system for detecting 3D positions and/or 3D orientations (i.e., poses) associated with detected movements of the input device 702.

The dongle 706 also includes a CPU (i.e., processor 722) that may bi-directionally communicate with input device 702 via CPU (i.e., processor 724) and/or CPU (i.e., processor 726, as shown by communication link 729 and/or 731, respectively. For example, EM data, identified poses, and/or other information may be exchanged between device 202 and computing device 704 via dongle 706 using any of processor 722, 724, and/or 726. For example, in some implementations, the processor 726 identifies poses based on the EM data identified via module 714 and communicates the identified poses to the processor 724 directly or via processor 722 on the dongle 706. The dongle can then pass (via USB, for example) the poses to the computing device 704. In some implementations, the processor 726 communicates the EM data to the processor 722 or processor 724, which identifies poses based on the EM data.

The communication links 729 and 731 can be a wired communication link, a wireless communication link (e.g., Bluetooth, ZigBee, RF, etc.), and the like, or a combination thereof. In other embodiments, the EM data can be sent to another device and/or processor (not shown) and the other device and/or processor may compute a pose from the EM data. In some implementations, the EM data may be stored locally within devices 702, 704, or 706, locally within the system 700, and/or remote from system 700.

The input device 702 also includes the EM receiver module 714 to generate EM data from detected EM fields. The EM receiver module 714 includes a receiver coil 728, an amplifier 730, and an ADC 732. In some implementations, the receiver coil 728 is a tri-axis coil configured to detect an analog electrical signal having a magnitude and/or phase indicative of a particular detected EM field. The ADC 732 is generally configured to receive the generated analog signal and convert the analog signal to a digital value indicative of the analog signal represented in the EM field 701. The digital values generated by the ADC 732 are EM data that can be used for pose identification for input device 702.

The input device 702 also includes an IMU sensor 734. The IMU sensor 734 may provide additional pose information about device 702. One or more of the processors 722, 724, or 726 (or another device processor) can use the additional pose information to supplement or augment the poses identified based on the EM data. For example, in some embodiments the processor 726 can use the additional pose information to identify potential errors in the poses determined based on the EM data, and to address the identified errors.

In some implementations, the processor 726 may use the additional pose information determined using IMU 734 to track input device 702, for example, when device 702 is out of range of the EM field produced by transmitter module 712. Thus, the IMU 734 may be utilized as a backup pose determiner in order to continue determining pose information and tracking data for device 702. For example, if device 702 is the input device 102 and the user operating device 102 moves out of range of computing device 704 (or dongle 706), the system 700 can still determine pose information well enough to track a moving device 102 such that content (e.g., cursor or 3D objects) within the computing device 106 can be properly moved based on movements of tracked input device 102. In this example, the pose information may be 3-DoF pose data based on detected 3D orientations of the device 102/702.

In some implementations, the dongle 706 includes the processor 722 and a wireless interface communicably coupled to the computing device 704 and communicably coupled to the input device 702. The dongle 706 may be operable to collect, from the processor 726, pose data associated with the input device 702. In some implementations, the dongle 706 may be operable to determine pose information from input device 702 when the device is not moving. The dongle 706 may then convert, using the processor 722 or 724, the position and orientation data (i.e., pose data). In some implementations, the dongle 706 may instead convert, using the processor 722 or 724, the position and/or orientation data retrieved from the IMU 734 of device 702. In either case, the position and/or orientation data may be used to generate commands for execution by the computing device 704. The commands may be transmitted from the dongle 706 to the computing device 704 over the USB interface generated by connectors 708/710, for example.

The input device 702 may also include a microphone 736 and a speaker 738. The input device 702 may include the microphone 736 for capturing audio spoken by user(s) accessing device 702. For example, the microphone may be configured to receive voice-based queries for generating communication from the input device 702 to the computing device 704. In some implementations, the captured audio is stored on the mouse for future playback or upload to a computer. In other embodiments, the audio is streamed to a computing device via a wireless connection for either storage or processing.

In some implementations, the speaker 738 is configured to generate audio playback from the input device 702. The audio playback may include information responsive to the voice-based queries received at the microphone 736. For example, if a user spoke a question or command into the microphone 736, the system 700 may stream the question to the computing device 704 (directly or via dongle 706), the computing device 704 may respond with an answer that is played back to the user through the speaker 738.

Although the microphone 736 and speaker 738 are not shown in systems 100, 200, 300, 600A, and 600B, both devices 736 and 738 may be included in a similar fashion, as described above.

In some implementations, the dongle 706 can be attached to the input device 702 for storage when not plugged into the computing device 704. In some implementations, the input device 702 may contain a female connector on a rear surface (e.g., for charging) and the dongle 706 may contain a male connector that can be mated with the input device female connector for storage. In another implementation, the input device 702 contains a compartment in which the dongle 706 can be stored.

Figure 8:
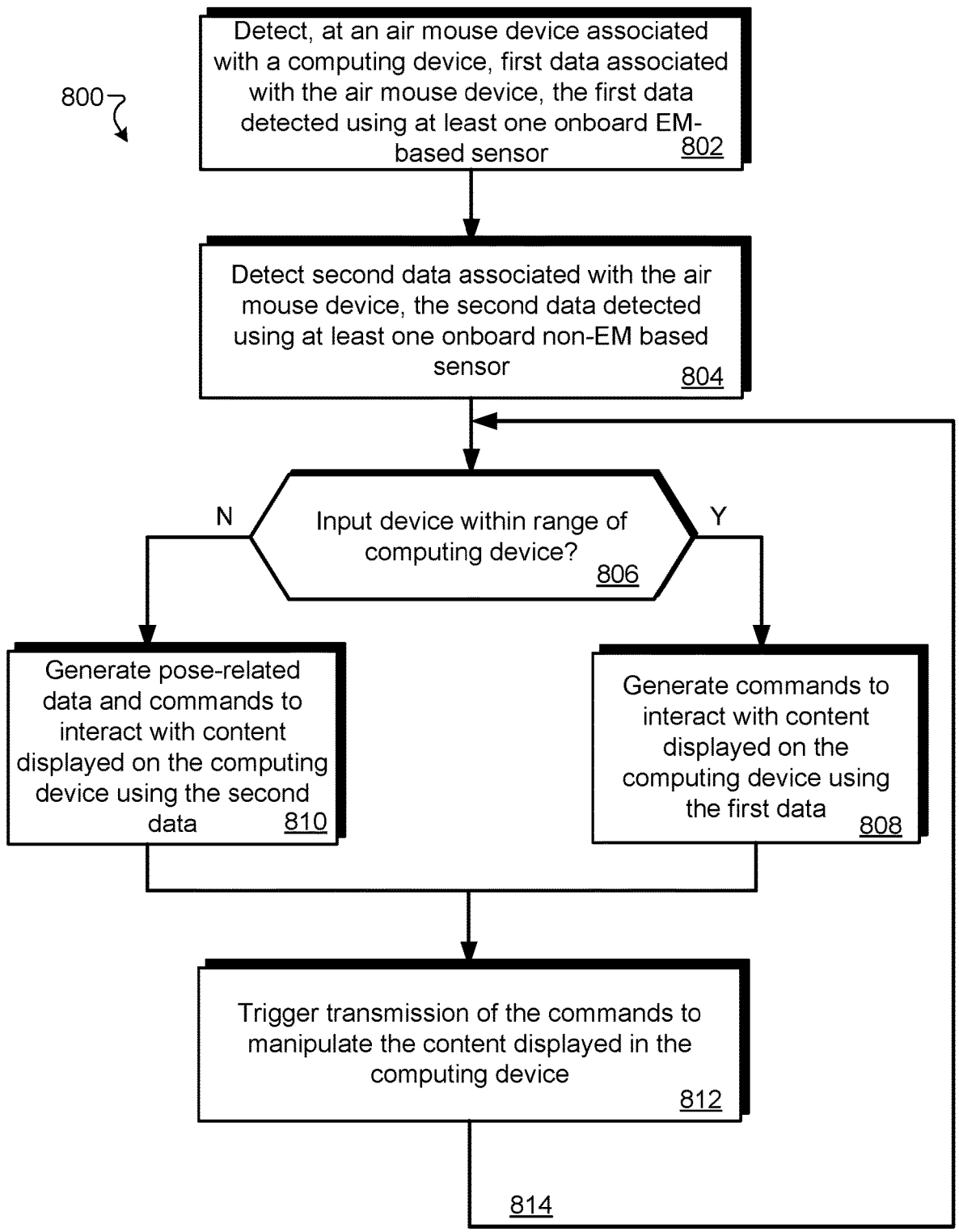
FIG. 8 is a flow chart diagramming an implementation of a process to track an input device, in accordance with implementations described herein.

FIG. 8 is a flow chart diagramming an implementation of a process 800 to track an input device in order to determine which data is used to generate commands for an associated computing device, in accordance with implementations described herein. The method 800 is described with respect to an example implementation at the EM tracking system 200 of FIG. 2, but it will be appreciated that the method can be implemented at EM tracking systems having other configurations.

At block 802, the process 800 may include detecting (at air mouse device 202) first data associated with the air mouse device 202. The first data may include movement data, position data, orientation data, or any combination thereof. The first data may be detected using at least one onboard EM-based sensor in system 200. For example, the device 202 may use EM receiver module 220 to detect position data and/or orientation data associated with the air mouse device 202. The EM receiver module may be associated with and/or capable of communication with the base device 204, which may be installed upon (or otherwise accessible to the computing device 106 displaying content in which the air mouse device 202 may control. In some implementations, the EM receiver module 220 may detect the first data to determine pose information for the device 202. The first data and the second data may pertain to position data, orientation, data, or both (i.e., pose data).

At block 804, the process 800 may include detecting additional data (i.e., second data) associated with the air mouse device 202. The second data may be detected using at least one onboard non-EM based sensor. For example, the non-EM based sensor may include the IMU 230 and the second data may include accelerometer and gyroscope information about device 202. The second data may be detected with respect to device 202 as a user moves device 202 in 3D space. In some implementations, the second data may be detected when device 202 is not moving.

At some point, a user may move device 202 and may cause device 202 to become in or out of range of an EM field associated with a base device (e.g., EM transmitter module 206 on device 204 installed in computing device 106). The range may be a predefined proximity range associated with the computing device. For example, the range may be defined based on a particular strength (e.g., transmit power) of the EM transmitter module 206 used to generate the EM field transmitting data between device 204 and device 202. An example range may include about one to about three meters. Other ranges are possible.

At block 806, a decision may be made for whether or not the device 202 is within range of the computing device 106 (connected to transmitter module 206). In response to determining that the air mouse device 202 is within a predefined proximity range of the computing device 106 and/or transmitter module 206, the device 202 may generate pose-related data (block 808) that a host computing device may translate into commands to interact with content displayed on the computing device using the first data. For example, commands may be generated by device 202 based at least in part on EM-based data because the device 202 is within range to use and transmit such data.

In response to determining that the air mouse device 202 is out of range of the predefined proximity range of the computing device, the device 202 may generate commands (block 810) to interact with content displayed on the computing device using the second data. For example, commands may be generated using IMU data based on detecting that the EM-based elements are unavailable for use.

Regardless of which data (first data or second data) is used, the air mouse device 202 may trigger transmission of pose-related data to the host computing device which may be used to manipulate the content displayed in the computing device, at block 812. The system 200 may continue to execute and determine first data and second data. Each time commands are to be generated, the system again begins to determine whether or not input device is within range of the computing device, as shown by arrow 814. For example, device 202 can continue to detect proximity to device 106 to determine whether or not EM data can be collected to identify poses. Thus, the process flow returns to block 806.

Figure 9:
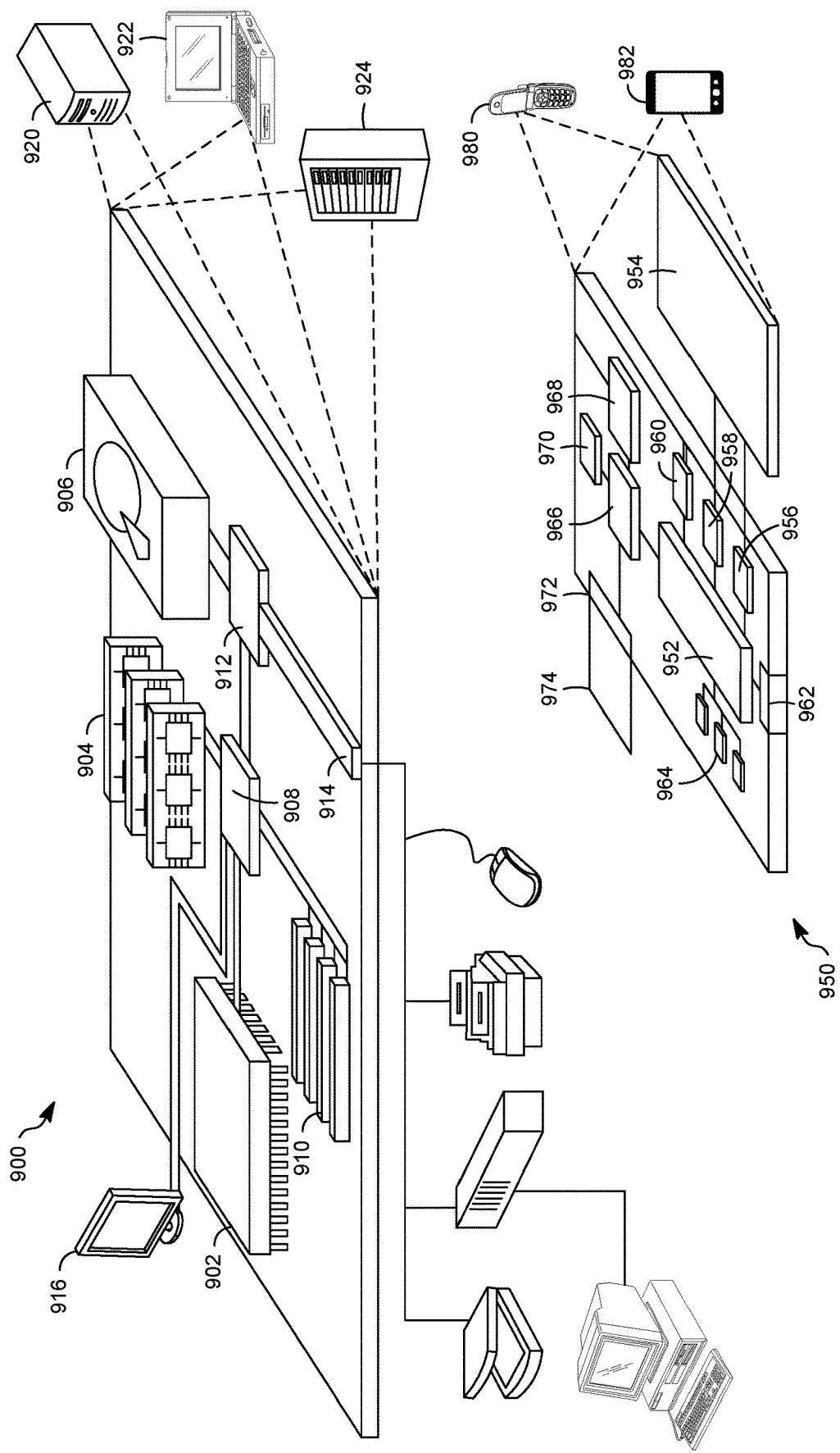
FIG. 9 illustrates an example of a computer device and a mobile computer device that can be used with the implementations described here.

FIG. 9 shows an example computer device 900 and an example mobile computer device 950, which may be used with the techniques described here. Features described with respect to the computer device 900 and/or mobile computer device 950 may be included in the portable computing device 100 described above. Computing device 900 is intended to represent various forms of digital computers, such as laptops, desktops, workstations, personal digital assistants, servers, blade servers, mainframes, and other appropriate computers. Computing device 950 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 900 includes a processor 902, memory 904, a storage device 906, a high-speed interface 908 connecting to memory 904 and high-speed expansion ports 910, and a low speed interface 912 connecting to low speed bus 914 and storage device 906. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, or memory on processor 902.

The high speed controller 908 manages bandwidth-intensive operations for the computing device 900, while the low speed controller 912 manages lower bandwidth-intensive operations. Such allocation of functions is exemplary only. In one implementation, the high-speed controller 908 is coupled to memory 904, display 916 (e.g., through a graphics processor or accelerator), and to high-speed expansion ports 910, which may accept various expansion cards (not shown). In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device (not shown), such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provide in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. Expansion memory 974 may also be provided and connected to device 950 through expansion interface 972, which may include, for example, a SIMM (Single In Line Memory Module) card interface. Such expansion memory 974 may provide extra storage space for device 950, or may also store applications or other information for device 950. Specifically, expansion memory 974 may include instructions to carry out or supplement the processes described above, and may include secure information also. Thus, for example, expansion memory 974 may be provide as a security module for device 950, and may be programmed with instructions that permit secure use of device 950. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, expansion memory 974, or memory on processor 952, that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver (not shown). In addition, GPS (Global Positioning System) receiver module 970 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smart phone 982, personal digital assistant, or other similar mobile device.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a standalone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of nonvolatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a backend component, e.g., as a data server, or that includes a middleware component, e.g., an application server, or that includes a frontend component, e.g., a client computer having a graphical user interface or a Web browser through which a user can interact with an implementation, or any combination of such backend, middleware, or frontend components. Components may be interconnected by any form or medium of digital data communication, e.g., a communication network. Examples of communication networks include a local area network (LAN) and a wide area network (WAN), e.g., the Internet.

The computing device according to example embodiments described herein may be implemented using any appropriate combination of hardware and/or software configured for interfacing with a user including a user device, a user interface (UI) device, a user terminal, a client device, or a customer device. The computing device may be implemented as a portable computing device, such as, for example, a laptop computer. The computing device may be implemented as some other type of portable computing device adapted for interfacing with a user, such as, for example, a PDA, a notebook computer, or a tablet computer. The computing device may be implemented as some other type of computing device adapted for interfacing with a user, such as, for example, a PC. The computing device may be implemented as a portable communication device (e.g., a mobile phone, a smart phone, a wireless cellular phone, etc.) adapted for interfacing with a user and for wireless communication over a network including a mobile communications network.

The computer system (e.g., computing device) may be configured to wirelessly communicate with a network server over a network via a communication link established with the network server using any known wireless communications technologies and protocols including radio frequency (RF), microwave frequency (MWF), and/or infrared frequency (IRF) wireless communications technologies and protocols adapted for communication over the network.

In accordance with aspects of the disclosure, implementations of various techniques described herein may be implemented in digital electronic circuitry, or in computer hardware, firmware, software, or in combinations of them. Implementations may be implemented as a computer program product (e.g., a computer program tangibly embodied in an information carrier, a machine-readable storage device, a computer-readable medium, a tangible computer-readable medium), for processing by, or to control the operation of, data processing apparatus (e.g., a programmable processor, a computer, or multiple computers). In some implementations, a tangible computer-readable storage medium may be configured to store instructions that when executed cause a processor to perform a process. A computer program, such as the computer program(s) described above, may be written in any form of programming language, including compiled or interpreted languages, and may be deployed in any form, including as a standalone program or as a module, component, subroutine, or other unit suitable for use in a computing environment. A computer program may be deployed to be processed on one computer or on multiple computers at one site or distributed across multiple sites and interconnected by a communication network.

Specific structural and functional details disclosed herein are merely representative for purposes of describing example embodiments. Example embodiments, however, may be embodied in many alternate forms and should not be construed as limited to only the embodiments set forth herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature in relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. A handheld electronic device for controlling three-dimensional content displayed in a user interface of a computing device, the handheld electronic device including:
    an electromagnetic sensing system for detecting, for the handheld electronic device, a pose of the handheld electronic device in three-dimensional space;
    an inertial measurement unit sensor for detecting, for the handheld electronic device, an orientation in three-dimensional space of the handheld electronic device in three-dimensional space;
    at least one processor coupled to memory, the at least one processor configured to generate commands to manipulate the three-dimensional content in the computing device, the commands being generated based on a determined proximity of the handheld electronic device relative to a receiver module associated with the computing device, the determined proximity triggering selection of data for use in generation of the commands, the data including:
    the pose of the electromagnetic sensing system when the determined proximity indicates that the handheld electronic device is within range of the receiver module, pose being indicative of orientation and position, and
    only the orientation of the inertial measurement unit sensor when the determined proximity indicates that the handheld electronic device is out of range of the receiver module; and
    at least one communication module to trigger transmission of the commands to manipulate the three-dimensional content displayed in the computing device based on detected changes in pose of the handheld electronic device.

2. The handheld electronic device of claim 1, wherein the handheld electronic device is an air mouse device configured to manipulate three-dimensional computer-aided design objects displayed in the user interface of the computing device, the manipulation of the three-dimensional computer-aided design objects being based on tracking the pose of the handheld electronic device in three-dimensional space.

3. The handheld electronic device of claim 1, wherein the handheld electronic device is configured to:
    prioritize use of the electromagnetic sensing system using six degrees of freedom while within range of the receiver module; and
    switch to perform sensing in three degrees of freedom using the inertial measurement unit sensor upon detecting that the handheld electronic device is out of range of the receiver module associated with the computing device.

4. The handheld electronic device of claim 1, wherein the computing device is removably attached to a dongle, the dongle including a second processor, a first communication interface with the computing device, and a second communication interface with the handheld electronic device, the dongle being operable to:
    collect, from the at least one processor of the handheld electronic device and using the first communication interface, data associated with the pose of the handheld electronic device;
    convert, using the second processor, the data from the electromagnetic sensing system or from the inertial measurement unit sensor, to the commands; and
    transmit the commands to the computing device using the second communication interface.

5. The handheld electronic device of claim 4, wherein the dongle further includes an electromagnetic receiver module to interface with a transmitter module associated with the handheld electronic device.

6. The handheld electronic device of claim 4, wherein:
    the handheld electronic device is configured to communicate pose information to the dongle via a wireless protocol; and
    the dongle is configured to communicate to the computing device via a wired protocol.

7. The handheld electronic device of claim 6, wherein the wireless protocol is Radio Frequency (RF) and the wired protocol is Universal Serial Bus (USB).

8. The handheld electronic device of claim 1, wherein the handheld electronic device further includes:
    a microphone configured to receive voice-based queries for communication from the handheld electronic device to the computing device; and
    a speaker configured to generate audio playback from the handheld electronic device, the audio playback including information responsive to the voice-based queries.

9. The handheld electronic device of claim 1, wherein the handheld electronic device is detected to be out of range of the computing device if a metric correlated to signal noise associated with the electromagnetic sensing system is above a noise threshold.

10. The handheld electronic device of claim 1, wherein the handheld electronic device further includes a removable trackball, the trackball including the at least one communication module, wherein the communication module is configured to transmit commands to control a three-dimensional object in the content according to movements of the trackball in three-dimensional space.

11. The handheld electronic device of claim 10, wherein a change in a detected pose associated with the trackball causes a corresponding change in a pose of the three-dimensional object.

12. A pose tracking system for an air mouse device comprising:
    an electromagnetic receiver device associated with the air mouse device and configured to determine a 6-DoF pose between a remote electromagnetic transmitter and the electromagnetic receiver device, the remote electromagnetic transmitter being associated with a computing device;
    an inertial measurement sensor configured to determine a 3-DoF pose of the air mouse device;
    at least one processor coupled to memory and configured to:
        generate commands using the 6-DoF pose to manipulate three-dimensional content displayed on the computing device, in response to detecting air mouse poses while the air mouse device is communicably coupled to the electromagnetic transmitter wherein the 6-DoF pose is indicative of orientation and position; and
        generate commands using the 3-DoF pose to manipulate three-dimensional content displayed on the computing device, in response to detecting air mouse poses while the air mouse device is beyond a predetermined range from the electromagnetic receiver device, wherein the 3-DoF pose is indicative of only orientation.

13. The pose tracking system of claim 12, wherein the predetermined range is based at least in part on at least one metric that corresponds to a received signal strength detected at the electromagnetic receiver device.

14. The pose tracking system of claim 12, further comprising at least one communication module to transmit the generated commands to the computing device to control the three-dimensional content displayed on the computing device.

15. The pose tracking system of claim 12, wherein the air mouse device further includes a removable trackball, the trackball including:
    an electromagnetic sensing system to detect a plurality of poses associated with the air mouse device,
    the at least one processor to generate the commands and to transmit commands to control the three-dimensional content according to movements of the trackball in three-dimensional space.

16. The pose tracking system of claim 12, wherein the processor is configured to:
    generate commands using the 3-DoF pose to trigger manipulation of three-dimensional content displayed on the computing device until the air mouse device is within range of the electromagnetic receiver device; and
    automatically switch to generating commands using the 6-DoF pose to trigger manipulation of three-dimensional content displayed on the computing device when the air mouse device is within range of the electromagnetic receiver device.

17. An air mouse device for controlling content displayed in a user interface of a computing device, the air mouse device including:
    an electromagnetic sensing system for detecting, for the air mouse device, a three-dimensional position and a three-dimensional orientation responsive to detected movements of the air mouse device in three-dimensional space;
    an inertial measurement unit sensor for detecting, for the air mouse device, a three-dimensional orientation in three-dimensional space;
    at least one processor coupled to memory, the at least one processor configured to generate commands to manipulate the content in the computing device, the commands being generated based on a determined proximity of the air mouse device relative to the computing device, the determined proximity triggering selection of data for use in generation of the commands, wherein the data includes:
        the three-dimensional position and the three-dimensional orientation associated with the electromagnetic sensing system when the determined proximity indicates that the air mouse device is within range of the computing device, and
        only the three-dimensional orientation of the inertial measurement unit sensor when the determined proximity indicates that the air mouse device is out of range of the computing device; and
    at least one communication module to trigger transmission of the commands to manipulate the content displayed in the computing device.

18. The air mouse device of claim 17, wherein the air mouse device is configured to manipulate three-dimensional computer-aided design objects displayed in the user interface of the computing device, the manipulation of the three-dimensional computer-aided design objects being based on tracking the position and orientation of the air mouse device in three-dimensional space.

19. The air mouse device of claim 17, wherein the air mouse device is configured to:
    prioritize use of the electromagnetic sensing system using six degrees of freedom while within range of the computing device; and
    switch to perform sensing in three degrees of freedom using the inertial measurement unit sensor upon detecting that the air mouse device is out of range of the computing device.

20. The air mouse device of claim 17, wherein the air mouse device is detected to be out of range of the computing device if a metric correlated to signal noise associated with the electromagnetic sensing system is above a predefined noise threshold.

21. A non-transitory processor-readable medium, comprising processor-readable instructions which, when executed, cause one or more processors to perform the steps of claim 1.

* * * * *